United States Patent
Joo et al.

(10) Patent No.: US 9,892,795 B2
(45) Date of Patent: Feb. 13, 2018

(54) NONVOLATILE MEMORY DEVICE AND METHOD OF OPERATING THE NONVOLATILE MEMORY DEVICE

(71) Applicant: SAMSUNG ELECTRONICS CO., LTD., Suwon-si, Gyeonggi-do (KR)

(72) Inventors: Sang-Hyun Joo, Suwon-si (KR); KeeHo Jung, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/350,134

(22) Filed: Nov. 14, 2016

(65) Prior Publication Data

US 2017/0169892 A1    Jun. 15, 2017

(30) Foreign Application Priority Data

Dec. 10, 2015    (KR) .................. 10-2015-0176054

(51) Int. Cl.
| | |
|---|---|
| *G11C 16/06* | (2006.01) |
| *G11C 16/26* | (2006.01) |
| *G11C 16/14* | (2006.01) |
| *G11C 16/04* | (2006.01) |
| *G11C 16/08* | (2006.01) |
| *G11C 16/34* | (2006.01) |

(52) U.S. Cl.
CPC .......... *G11C 16/26* (2013.01); *G11C 16/0466* (2013.01); *G11C 16/0483* (2013.01); *G11C 16/08* (2013.01); *G11C 16/14* (2013.01); *G11C 16/3445* (2013.01)

(58) Field of Classification Search
CPC ..... G11C 16/26; G11C 16/0483; G11C 16/10; G11C 16/04; G11C 16/08; G11C 16/3404; G11C 16/3459; G11C 16/349; G11C 7/1021; G11C 7/22
USPC ............ 365/185.22, 185.09, 185.12, 185.18, 365/185.2, 185.24, 189.05, 200, 238.5, 365/239
See application file for complete search history.

(56) References Cited

U.S. PATENT DOCUMENTS

| | | |
|---|---|---|
| 7,304,893 B1 | 12/2007 | Hemink |
| 7,539,922 B2 | 5/2009 | Kim |
| 7,590,006 B2 | 9/2009 | Tokiwa |
| 7,616,499 B2 | 11/2009 | Wan et al. |
| 7,679,133 B2 | 3/2010 | Son et al. |
| 8,270,215 B2 | 9/2012 | You et al. |
| 8,456,915 B2 | 6/2013 | Chen et al. |
| 8,553,466 B2 | 10/2013 | Han et al. |
| 8,559,235 B2 | 10/2013 | Yoon et al. |

(Continued)

*Primary Examiner* — Thong Q Le
(74) *Attorney, Agent, or Firm* — Lee & Morse, P.C.

(57) ABSTRACT

A nonvolatile memory device includes a memory cell array, a row decoder, and page buffer, and control logic. The memory cell array includes cell strings connected to select lines. Each select line is connected to two or more cell strings, each cell string includes memory cells connected to a plurality of word lines, and a select transistor is connected to a corresponding one of the select lines. The row decoder sequentially selects the select lines in a read operation. A page buffer obtains a read result of the two or more cell strings when a corresponding select line is selected and accumulates read results of the cell strings when the select lines are sequentially selected. The control logic controls a subsequent operation based on the accumulated read results.

13 Claims, 17 Drawing Sheets

(56) References Cited

U.S. PATENT DOCUMENTS

| | | |
|---|---|---|
| 8,654,587 B2 | 2/2014 | Yoon et al. |
| 8,923,056 B2 | 12/2014 | Kim |
| 9,070,474 B2 | 6/2015 | Izumi |
| 2008/0225598 A1 | 9/2008 | Jung et al. |
| 2011/0233648 A1 | 9/2011 | Seol et al. |
| 2012/0314504 A1 | 12/2012 | Komai |
| 2014/0258794 A1 | 9/2014 | Yang et al. |
| 2015/0043283 A1* | 2/2015 | Kwak ................ H01L 27/1157 365/185.22 |

* cited by examiner

| | BL1 | BL2 | BL3 | BL4 |
|---|---|---|---|---|
| SSL1a | P | P | P | P |
| SSL2a | P | P | P | F |
| SSL3a | P | P | F | F |
| SSL4a | P | F | F | F |
| Accumulated Result | P | F | F | F |

…

NONVOLATILE MEMORY DEVICE AND METHOD OF OPERATING THE NONVOLATILE MEMORY DEVICE

CROSS-REFERENCE TO RELATED APPLICATION

Korean Patent Application No. 10-2015-0176054, filed on Dec. 10, 2015, and entitled, "Nonvolatile Memory Device and Method of Operating the Nonvolatile Memory Device," is incorporated by reference herein in its entirety.

BACKGROUND

1. Field

One or more embodiments described herein relate to a nonvolatile memory device and a method of operating a nonvolatile memory device.

2. Description of the Related Art

Storage devices store data under the control of a host device such as a computer, a smart phone, a smart pad, etc. Examples of storage devices include a device for storing data in a magnetic disk (e.g., a hard disk drive) and a device for storing data in a semiconductor memory, e.g., a nonvolatile memory like a solid state drive, a memory card, etc. Examples of a nonvolatile memory include a read only memory (ROM), a programmable ROM, an electrically programmable ROM, an electrically erasable and programmable ROM, a flash memory, a phase-change random access memory (RAM), a magnetic RAM, a resistive RAM, and ferroelectric RAM. In order to keep pace with advancements in semiconductor manufacturing technology, attempts are being made to increase the operation speed and capacity of the host device of the memory.

SUMMARY

In accordance with one or more embodiments, a nonvolatile memory device includes a memory cell array including a plurality of cell strings connected to a plurality of select lines, each of the select lines connected to two or more cell strings, each of the cell strings including memory cells connected to a plurality of word lines, and a select transistor connected to a corresponding one of the select lines among the plurality of select lines; a row decoder to sequentially select the plurality of select lines in a read operation; a page buffer to obtain a read result of the two or more cell strings when a corresponding select line is selected and to accumulate read results of the plurality of cell strings when the plurality of select lines is sequentially selected; and control logic to control a subsequent operation based on the accumulated read results.

In accordance with one or more other embodiments, a method is provided for operating a nonvolatile memory device including a plurality of cell strings, each of the cell strings including a plurality of memory cells. The method includes obtaining a first read result by performing a read operation with respect to first cell strings among the plurality of cell strings; obtaining a second read result by performing a read operation with respect to second cell strings among the plurality of cell strings; generating a third read result by accumulating the first read result and the second read result; and performing a subsequent operation according to the third read result.

In accordance with one or more other embodiments, an apparatus includes first logic to perform a read operation for first cell strings of a memory to generate a first read result; second logic to perform a read operation for second cell strings of the memory to generate a second read result; and third logic to perform a subsequent operation based on a third read result, wherein the third read result is based on the first read result and the second read result.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
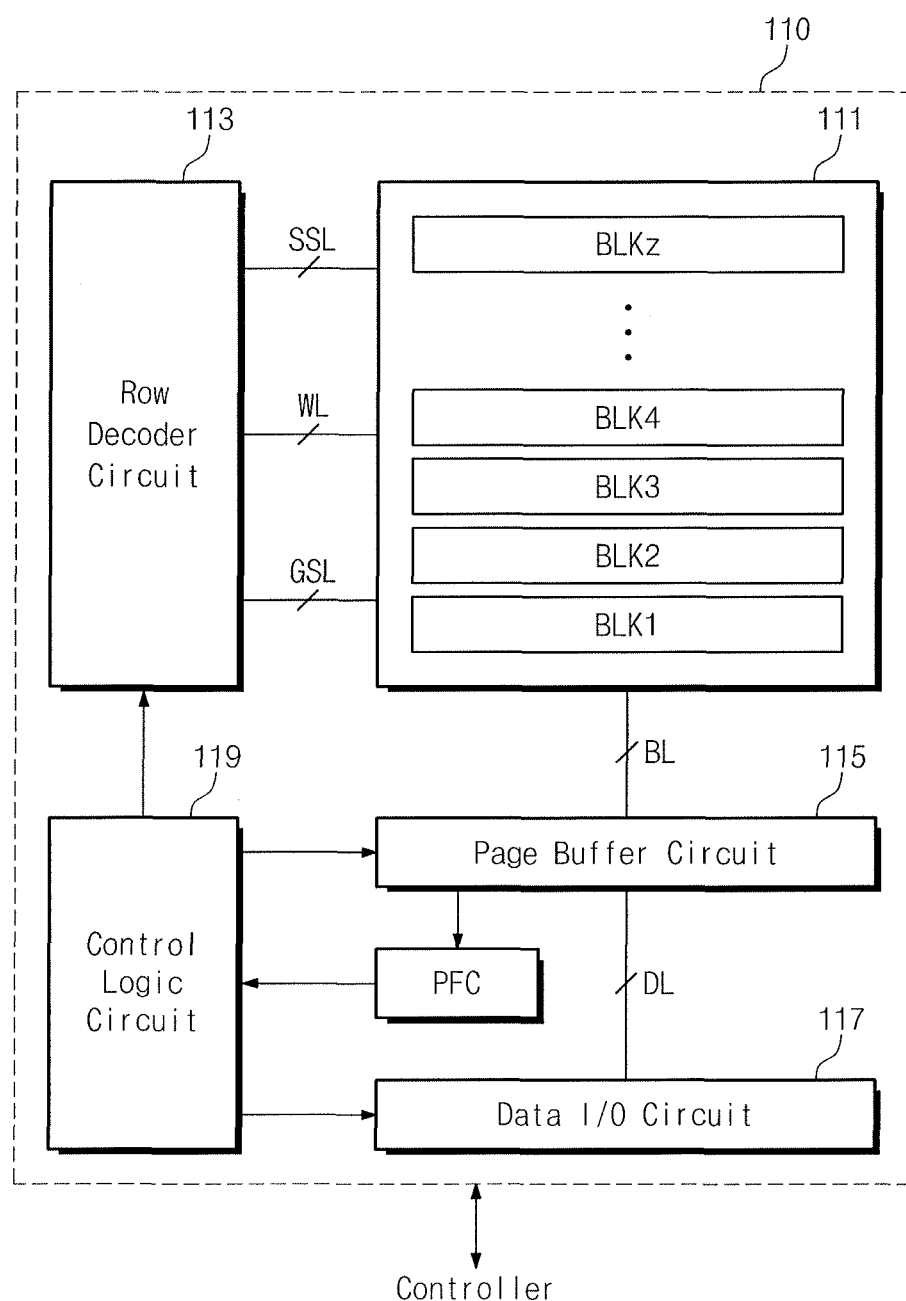
FIG. 1 illustrates an embodiment of a nonvolatile memory device.

FIG. 1 illustrates an embodiment of a nonvolatile memory device 110 including a memory cell array 111, a row decoder circuit 113, a page buffer circuit 115, a pass/fail check circuit (PFC), a data input/output circuit 117 and a control logic circuit 119.

The memory cell array 111 includes a plurality of memory blocks BLK1~BLKz. Each memory block may be connected to the row decoder circuit 113 through at least one ground select line GSL, a plurality of word lines WL, and at least one string select line SSL. Each memory block may be connected to the page buffer circuit 115 through a plurality of bit lines BL. The memory blocks BLK1~BLKz may be connected to the bit lines BL in common. In one embodiment, memory cells of memory blocks BLK1~BLKz may all have the same structure.

Each of the memory blocks BLK1~BLKz may include an erase operation unit. Memory cells of the memory cell array 111 may be erased at the same time by a memory block unit.

Each of the memory blocks BLK1~BLKz may be divided into a plurality of sub blocks. Each sub block may include an erase operation unit.

Each of the memory blocks BLK1~BLKz may include a physical storage space discriminated by a block address. Each of the word lines WL may correspond to a physical storage space discriminated by a row address. Each of the bit lines BL may correspond to a physical storage space discriminated by a column address.

Each memory block includes a plurality of physical pages and each physical page may include a plurality of memory cells. Each physical page may be a program operation unit. Memory cells of each physical page may be programmed at the same time. Each physical page may include a plurality of logical pages. Bits programmed in each of memory cells of each physical page may form logical pages. First bits programmed in memory cells of each physical page may form a first logical page. Kth bits programmed in memory cells of each physical page may form a Kth logical page.

The row decoder circuit 113 is connected to the memory cell array 111 through a plurality of ground select lines GSL, a plurality of word lines WL, and a plurality of string select lines SSL. The row decoder circuit 113 operates under the control of the control logic circuit 119. The row decoder circuit 113 may decode an address received from a controller 120 through an input/output channel and control voltages applied to the string select lines SSL, the word lines WL and the ground select lines GSL according to the decoded address.

For example, in a program operation, the row decoder circuit 113 may apply a program voltage to a selected word line of a selected memory block by an address and may apply a pass voltage to unselected word lines of the selected memory block. In a read operation, the row decoder circuit 113 may apply a select read voltage to a selected word line of a selected memory block by an address and may apply an unselect read voltage to unselected word lines of the selected memory block. In an erase operation, the row decoder circuit 113 may apply erase voltages (e.g., a ground voltage or low voltages having levels substantially equal to ground voltage) to words line of a selected memory block by an address.

The page buffer circuit 115 is connected to the memory cell array 111 through the bit lines BL. The page buffer circuit 115 is connected to the data input/output circuit 117 through a plurality of data lines DL. The page buffer circuit 115 operates according to a control of the control logic circuit 119.

In a program operation, the page buffer circuit 115 may store data to be programmed in memory cells. The page buffer circuit 115 may apply voltages to the bit lines BL based on the stored data. For example, the page buffer circuit 115 may function as a write driver. In a read operation or a verify-read operation, the page buffer circuit 115 may sense voltages of the bit lines BL and store a sensing result. For example, the page buffer circuit 115 may function as a sense amplifier.

After the verify-read operation, the pass/fail check circuit (PFC) may receive a sensing result from the page buffer circuit 115. Based on the received sensing result, the pass/fail check circuit (PFC) may determine a fail or a pass. For example, in a program verify read operation, if the number of on-cells is greater than a threshold value, the pass/fail check circuit (PFC) may determine a fail. If the number of on-cells is less than the threshold value, the pass/fail check circuit (PFC) may determine a pass. For example, in an erase verify read operation, the page buffer circuit 115 may count the number of off-cells being turned off. If the number of off-cells is greater than a threshold value, the pass/fail check circuit (PFC) may determine a fail. If the number of off-cells is less than the threshold value, the pass/fail check circuit (PFC) may determine a pass. A determination result of pass or fail is transmitted to control logic circuit 119.

The data input/output circuit 117 is connected to the page buffer circuit 115 through the data lines DL. The data input/output circuit 117 may output data read by the page buffer circuit 115 and transmit data received from the controller 120 through an input/output channel to the page buffer circuit 115.

The control logic circuit 119 may receive a command from the controller 120 through the input/output channel and may receive a control signal through a control channel. In response to the control signal. The control logic circuit 119 may receive a command through the input/output channel, route an address received through the input/output channel to the row decoder circuit 113, and route data received through the input/output channel to the data input/output circuit 117. The control logic circuit 119 may decode the received command and control the nonvolatile memory device 110 according to the decoded command.

In a read operation, the control logic circuit 119 may generate a data strobe signal DQS from a read enable signal (/RE) received through the control channel. The generated data strobe signal DQS may be output to the controller 120 through the control channel. In a program operation, the control logic circuit 119 may receive the data strobe signal DQS from the controller 120 through the control channel.

According to control of the control logic circuit 119, a program operation, an erase operation, and a read operation may be performed in memory cells of each memory block. The program operation may include a plurality of program loops. For example, a program loop may be repeated until a pass is determined.

Each program loop may include a program operation and a verify operation. In the program operation, the page buffer circuit 115 may apply voltages to bit lines BL according to data to be programmed. For example, a ground voltage and a low voltage having a level equal to, or substantially equal to, a ground voltage may be applied to a bit line corresponding to a memory cell of which a threshold voltage increases. A power supply voltage and a positive voltage having a level equal to, or substantially equal to, the power supply voltage may be applied to a memory cell (e.g., a memory cell in which a program will be prohibited) of which a threshold voltage does not increase. The row decoder circuit 113 may apply a program voltage to a word line connected to selected memory cells and may apply a pass voltage to the remaining word lines. In a verify operation, a program result may be verified.

The verify operation may include a verify-read operation and a pass/fail determination. In the verify read operation, the page buffer circuit 115 may apply a power supply voltage and a positive voltage having a level equal to, or substantially equal to, the power supply voltage to the bit lines BL or bit lines corresponding to memory cells which are targets of the verify read. The row decoder circuit 113 may apply a verify voltage to a word line connected to selected memory cells which are verify targets and may apply a read pass voltage to the remaining word lines. A verify read result may be sensed in the page buffer circuit 115 and may be transmitted to the pass/fail check circuit (PFC). In a pass/fail determination operation, the pass/fail check circuit (PFC) may determine a pass or a fail according to the verify-read result.

In a program operation of the nonvolatile memory device 110, the nonvolatile memory device 110 may sequentially receive bits to be programmed in each memory cell of a selected physical page of the memory cell array 111 and may complete a program of the selected physical page through a single program operation based on the sequentially received bits. Completion of a program may correspond, for example, to the case where bits to be programmed in a corresponding physical page are all programmed in a readable state and an additional program with respect to the corresponding physical page is prohibited.

A read operation is performed similar to a verify-read operation. In the read operation, the page buffer circuit 115 may apply a power supply voltage or a positive voltage having a similar level to the power supply voltage to the bit lines BL or bit lines corresponding to memory cells which are targets of verify read. The row decoder circuit 113 may apply a read voltage to a word line connected to selected memory cells which are targets of read operation and apply a read pass voltage to the remaining word lines. A result of read operation may be sensed in the page buffer circuit 115 and may be output through data input/output circuit 117.

An erase operation may include a plurality of erase loops. For example, an erase loop may be repeated until a pass is determined. Each erase loop may include erase and verification operations. In an erase operation, the row decoder circuit 113 may apply a ground voltage or low voltages having a level equal to, or substantially equal to, the ground voltage to word lines connected to selected memory cells. An erase voltage may be applied to channels of the selected memory cells through a substrate. In a verify operation, an erase result may be verified. The verify operation may include a verify read and a pass/fail determination. In a verify-read operation, the page buffer circuit 115 may apply a power supply voltage and a positive voltage having a level equal to, or substantially equal to, the power supply voltage to the bit lines BL or bit lines corresponding to memory cells which are targets of the verify read. The row decoder circuit 113 may apply an erase verify voltage to word lines connected to selected memory cells which are verify targets. A result of verify read may be sensed in the page buffer circuit 115 and transmitted to the pass/fail check circuit (PFC). In a pass/fail determination, the pass/fail check circuit (PFC) may determine a pass or a fail according to the result of verify read.

Figure 2:
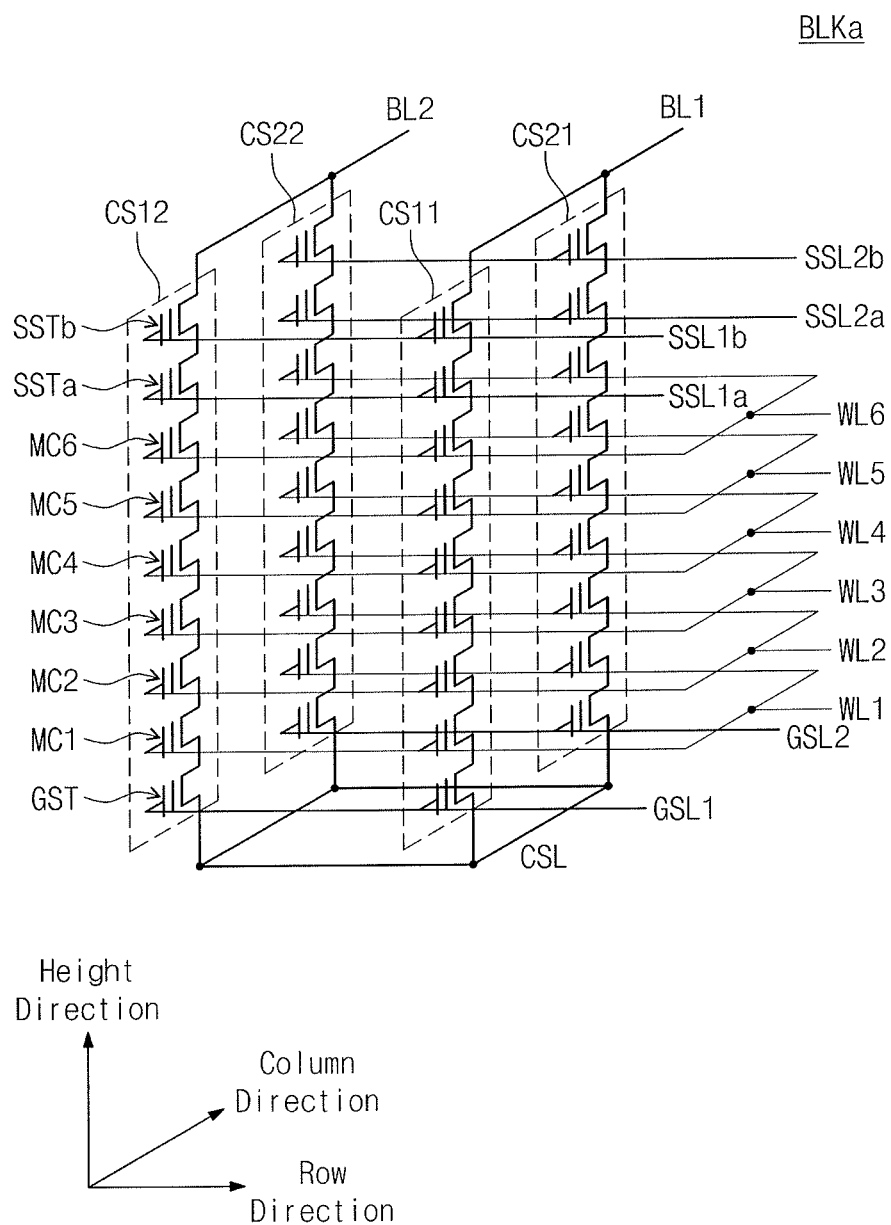
FIG. 2 illustrates an embodiment of a memory block.

FIG. 2 illustrates an embodiment of a memory block BLKa which includes a plurality of cell strings (CS11~CS21, CS12~CS22). The cell strings (CS11~CS21, CS12~CS22) may be arranged along a row direction and a column direction to form rows and columns. For example, the cell strings CS11 and CS12 along the row direction may form a first row and the cell strings CS21 and CS22 along the row direction may form a second row. The cell strings CS11 and CS21 along the column direction may form a first column and the cell strings CS12 and CS22 along the column direction may form a second column.

Each cell string may include a plurality of transistors. The cell transistors include ground select transistors GST, memory cells MC1~MC6, and string select transistors SSTa and SSTb. The ground select transistor GST, the memory cells MC1~MC6 and string select transistors SSTa and SSTb of each cell string may be stacked in a height direction perpendicular to or otherwise crossing a plane (e.g., a plane on a substrate of the memory block BLKa) on which the cell strings (CS11~CS21, CS12~CS22) are arranged along rows and columns.

The cell transistors may be charge trap type transistors with threshold voltages that vary based on the amount of charges trapped in an insulating layer.

Sources of the lowermost ground select transistors GST may be connected to a common source line CSL in common.

Control gates of the ground select transistors GST of the cell strings CS11 and CS12 of the first row are connected to a ground select line GSL1 in common and control gates of the ground select transistors GST of the cell strings CS21 and CS22 of the second row are connected to a ground select line GSL2 in common. For example, cell strings of different rows are connected to different ground select lines.

The memory block BLKa may be changed so that ground select transistors of different heights of the same row are connected to different ground select lines. For example, the memory block BLKa may be changed so that ground select lines connected to ground select transistors of the same height of different rows are connected to one another to be controlled in common. The memory block BLKa may be changed so that ground select lines connected to ground select transistors are connected to one another to be controlled in common.

Control gates of memory cells at the same height (or order) from a substrate (or ground select transistors GST) may be connected to one word line in common. Control gates of memory cells at different heights (or orders) from the substrate (or ground select transistors GST) may be connected to different word lines WL1~WL6 respectively. For example, the memory cells MC1 are connected to the word line WL1 in common. The memory cells MC2 are connected to the word line WL2 in common. The memory cells MC3 are connected to the word line WL3 in common. The memory cells MC4 are connected to the word line WL4 in common. The memory cells MC5 are connected to the word line WL5 in common. The memory cells MC6 are connected to the word line WL6 in common.

At first string select transistors SSTa of the same height (or order) of the cell strings (CS11~CS21, CS12~CS22), control gates of the first string select transistors SSTa of different rows are connected to different string select lines SSL1a~SSL2a respectively. For example, the first string select transistors SSTa of the cell strings CS11 and CS12 are connected to the string select line SSL1a in common. The first string select transistors SSTa of the cell strings CS21 and CS22 are connected to the string select line SSL2a in common.

At second string select transistors SSTb of the same height (or order) of the cell strings (CS11~CS21, CS12~CS22), control gates of the second string select transistors SSTb of different rows are connected to different string select lines SSL1b~SSL2b respectively. For example, the second string select transistors SSTb of the cell strings CS11 and CS12 are connected to the string select line SSL1b in common. The second string select transistors SSTb of the cell strings CS21 and CS22 are connected to the string select line SSL2b in common.

For example, cell strings of different rows are connected to different string select lines. String select transistors of the same height (or order) of cell strings of the same row are connected to the same string select line. String select transistors of different heights (or orders) of cell strings of the same row are connected to different string select lines.

String select transistors of cell strings of the same row may be connected to one string select line in common. For example, the string select transistors SSTa and SSTb of the cell strings CS11 and CS12 of the first row may be connected to one string select line in common. The string select transistors SSTa and SSTb of the cell strings CS21 and CS22 of the second row may be connected to one string select line in common.

Columns of the cell strings (CS11~CS21, CS12~CS22) are connected to different bit lines BL1 and BL2 respectively. For example, the string select transistors SSTb of the cell strings CS11~CS21 of the first column are connected to the bit line BL1 in common. The string select transistors SSTb of the cell strings CS12~CS22 of the second column are connected to the bit line BL2 in common.

In the memory block BLKa, memory cells at the same height from the substrate may be characterized by sharing a word line. In other memory blocks, word lines may be characterized not to be shared. For example, a memory cell of a first height of a first memory block may share a word line with other memory cells of the first height of the first memory block. The memory cell of the first height of the first memory block may not share a word line with a memory cell of the first height of a second memory block. A sub block may be characterized as a part of the memory block BLKa.

The cell strings CS11 and CS12 may form a first plane. The cell strings CS21 and CS22 may form a second plane.

In a memory block BLKa, memory cells of each height of each plane may form a physical page. The physical page may be a write unit and a read unit. For example, one plane of the memory block BLKa may be selected by the string select lines SSL1a, SSL1b, SSL2a and SSL2b. When a turn-on voltage is supplied to the string select lines SSL1a and SSL1b and a turn-off voltage is supplied to the string select lines SSL2a and SSL2b, the cell strings CS11 and CS12 of the first plane are connected to the bit lines BL1 and BL2. That is, the first plane is selected. When a turn-on voltage is supplied to the string select lines SSL2a and SSL2b and a turn-off voltage is supplied to the string select lines SSL1a and SSL1b, the cell strings CS21 and CS22 of the second plane are connected to the bit lines BL1 and BL2. That is, the second plane is selected.

In the selected plane, one row of the memory cells MC may be selected by the word lines WL1~WL6. In the selected row, a select voltage may be applied to the second word line WL2 and an unselect voltage may be applied to the remaining word lines WL1 and WL3~WL6. That is, a physical page corresponding to the second word line WL2 of the second plane may be selected by controlling voltages of the string select lines SSL1a, SSL1b, SSL2a and SSL2b and the word lines WL1~WL6. In the memory cells MC2 of the selected physical page, a write or read operation may be performed.

Two or more bits may be written in each of the memory cells MC. Bits written in each of the memory cells MC that belong to one physical page form logical pages. A first bit written in each of the memory cells MC that belong to one physical page forms a first logical page. An Nth bit written in each of the memory cells MC that belong to one physical page forms an Nth logical page. The logical page may be a unit of data access. When a read operation is performed in one physical page, data may be accessed by a logical page unit.

In the memory block BLKa, an erase of the memory cells MC1~MC6 may be performed by a memory block unit or a sub block unit. When an erase operation is performed by a memory block unit, all the memory cells MC of the memory block BLKa may be erased at the same time according to an erase request (e.g., an erase request from an external memory controller). When an erase operation is performed by a sub block unit, part of the memory cells MC1~MC6 of the memory block BLKa may be erased at the same time according to an erase request and the remaining memory cells may be erase-prohibited. A low voltage (for example, a ground voltage or a voltage having a level substantially equal to ground voltage) may be supplied to a word line connected to memory cells MC being erased. A word line connected to erase-prohibited memory cells MC may be floated.

The memory block BLKa illustrated in FIG. 2 is merely illustrative. In another embodiment, the number of rows of cell strings may more or less than in FIG. 2. As the number of rows of cell strings changes, the number of string select lines or ground select lines connected to rows of the cell strings and the number of cell strings connected to one bit line may change.

The number of columns of cell strings may more or less than in FIG. 2. As the number of columns of cell strings changes, the number of bit lines connected to columns of the cell strings and the number of cell strings connected to one string select line may change.

The height of the cell strings may be more or less than in FIG. 2. For example, the number of ground select transistors, memory cells, or string select transistors that are stacked on each cell string may increase or decrease.

Memory cells MC that belong to one physical page may correspond to at least three logical pages. For example, k (k is a positive integer greater than 2) number of bits may be programmed in one memory cell MC. In the memory cells MC that belong to one physical page, k number of bits being programmed in each memory cell MC may form k number of logical pages respectively.

In one embodiment, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" may correspond to the case where layers of each level of the array are directly deposited on the layers of each underlying level of the array.

In one embodiment, the 3D memory array includes vertical NAND strings that are vertically oriented such that at least one memory cell is located over another memory cell. The at least one memory cell may include a charge trap layer. Each vertical NAND string may include at least one select transistor over memory cells, the at least one select transistor having the same structure with the memory cells and formed monolithically with the memory cells.

The following documents are incorporated by reference herein and describe example configurations for three-dimensional memory arrays, in which the three-dimensional memory array includes a plurality of levels and in which word lines and/or bit lines shared between levels: U.S. Pat. Nos. 7,679,133; 8,553,466; 8,654,587; 8,559,235; and US Pat. Pub. No. 2011/0233648.

Figure 3:
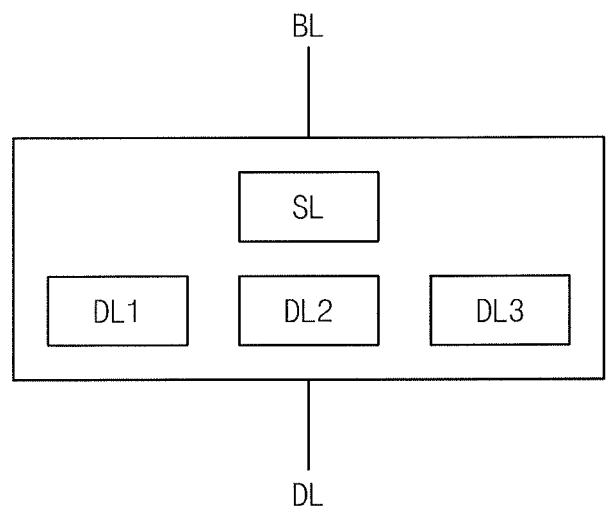
FIG. 3 illustrates an embodiment of a page buffer circuit.

FIG. 3 illustrates an embodiment of the page buffer circuit 115 of FIG. 1. A constitution of the page buffer circuit 115 corresponding to one bit line BL is illustrated in FIG. 3.

Referring to FIGS. 1 and 3, the page buffer circuit 115 includes a sense latch SL and first through third data latches DL1~DL3 corresponding to one bit line BL. In a program operation, the first through third data latches DL1~DL3 may correspond to respective logical pages that will be programmed in a selected physical page. For example, a bit of a first logical page that will be programmed in the selected logical page may be loaded into the first data latch DL1. A bit of a second logical page that will be programmed in the selected logical page may be loaded into the second data latch DL2. A bit of a third logical page that will be programmed in the selected logical page may be loaded into the third data latch DL3.

The sense latch SL may control whether to program a selected memory cell that belongs to a selected physical page and corresponds to a bit line BL based on the first through third data latches DL1~DL3. For example, when the selected memory cell is a program target, the sense latch SL may be set as a first value. When the selected memory cell is program-prohibited, the sense latch SL may be set as a second value different from the first value.

In a read operation or a verify-read operation, the sense latch SL may latch a voltage of the bit line BL. The voltage of the bit line BL is a result of the read operation or the verify-read operation and may include information about a threshold voltage of the selected memory cell that belongs to the selected physical page and is connected to the bit line BL. A result of the read operation or the verify-read operation obtained by the sense latch SL may be dumped in one of the first through third data latches DL1~DL3. For example, the result of the read operation or the verify-read operation obtained by the sense latch SL may be dumped in the first data latch DL1.

In the verify-read operation, information dumped in the first data latch DL1 may be transmitted to the pass/fail check circuit (PFC). The pass/fail check circuit (PFC) may determine a pass or a fail based on the result of the verify-read operation.

In FIG. 3, the page buffer circuit 115 has three data latches DL1~DL3 corresponding to one bit line BL. In another embodiment, the page buffer circuit 115 may have a different number of data latches DL1~DL3 with respect to one bit line BL.

Figure 4:
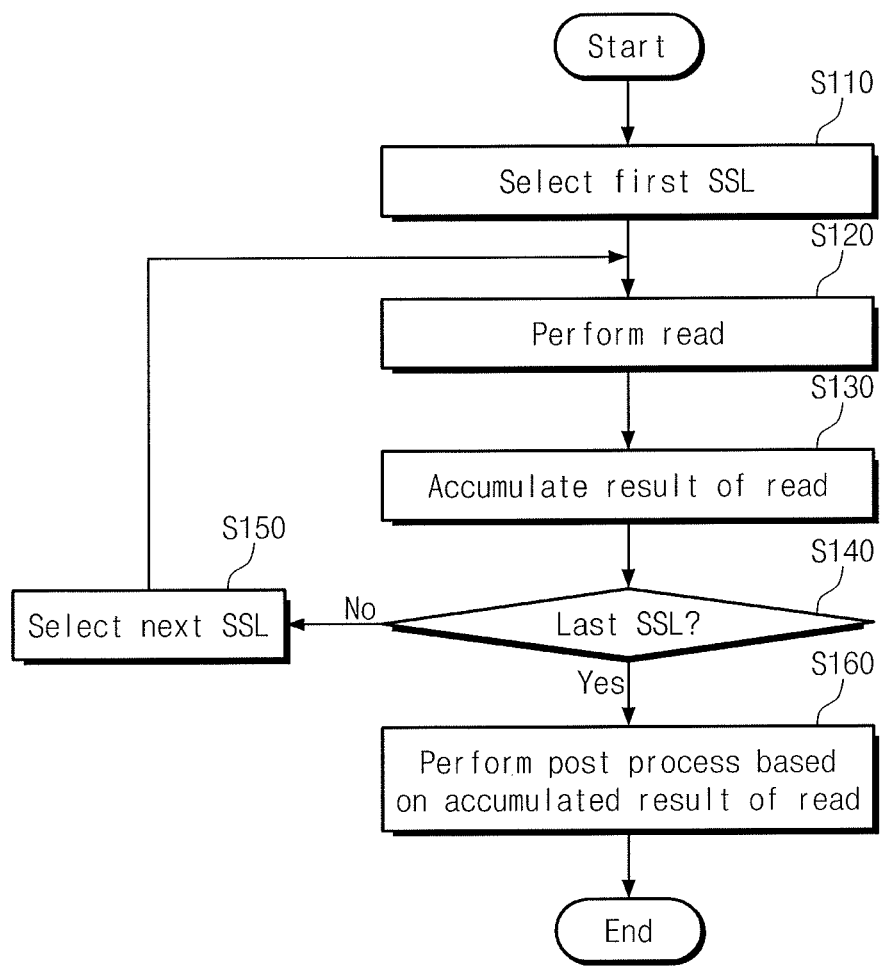
FIG. 4 illustrates an embodiment of a method to operate a nonvolatile memory device.

FIG. 4 illustrates an embodiment of a method for operating a nonvolatile memory device 110. As an example, a method is described for the case where the nonvolatile memory device 110 performs a read operation with respect to a memory block BLKa.

Referring to FIGS. 1 through 4, in operation S110, the nonvolatile memory device 110 selects a first string select line in the memory block BLKa. For example, the nonvolatile memory device 110 may select a first select line (e.g., SSLa or SSLb) among string select lines (e.g., SSL1*a* and SSL2*a*, or SSL1*b* and SSL2*b*) at the same height.

In operation S120, the nonvolatile memory device 110 performs a read operation in relation to the selected string select line. For example, the row decoder circuit 113 may apply voltages for performing a read operation with respect to select transistors or memory cells associated with the selected string line to the select lines (SSL1*a*, SSL1*b*, SSL2*a*, SSL2*b*, GSL1, GSL2) and the word lines WL.

In operation S130, the nonvolatile memory device 110 accumulates a result of the read operation. For example, the page buffer circuit 115 may update one (e.g., DL1) among the data latches DL1~DL3 based on the result of the read operation obtained by the sense latch SL.

In operation S140, the nonvolatile memory device 110 determines whether the selected string select line is the last string select line. If the selected string select line is not the last string select line, in operation S150 the nonvolatile memory device 110 selects a next string select line. Subsequently, the nonvolatile memory device 110 may perform operation S120 again.

If the selected string select line is the last string select line, in operation S160 the nonvolatile memory device 110 may perform a subsequent operation based on the accumulated result of the read operation.

As illustrated in FIG. 4, the nonvolatile memory device 110 may sequentially select a plurality of string select lines that belongs to the memory block BLKa to perform a read operation. A result of the read operation may be accumulated in the page buffer circuit 115. The accumulated result of the read operation may include information relating to all the read operations performed in relation to the string select lines. If the read operations are completed, the nonvolatile memory device 110 may perform a subsequent operation based on the result of the read operation accumulated in the page buffer circuit 115.

Figure 5:
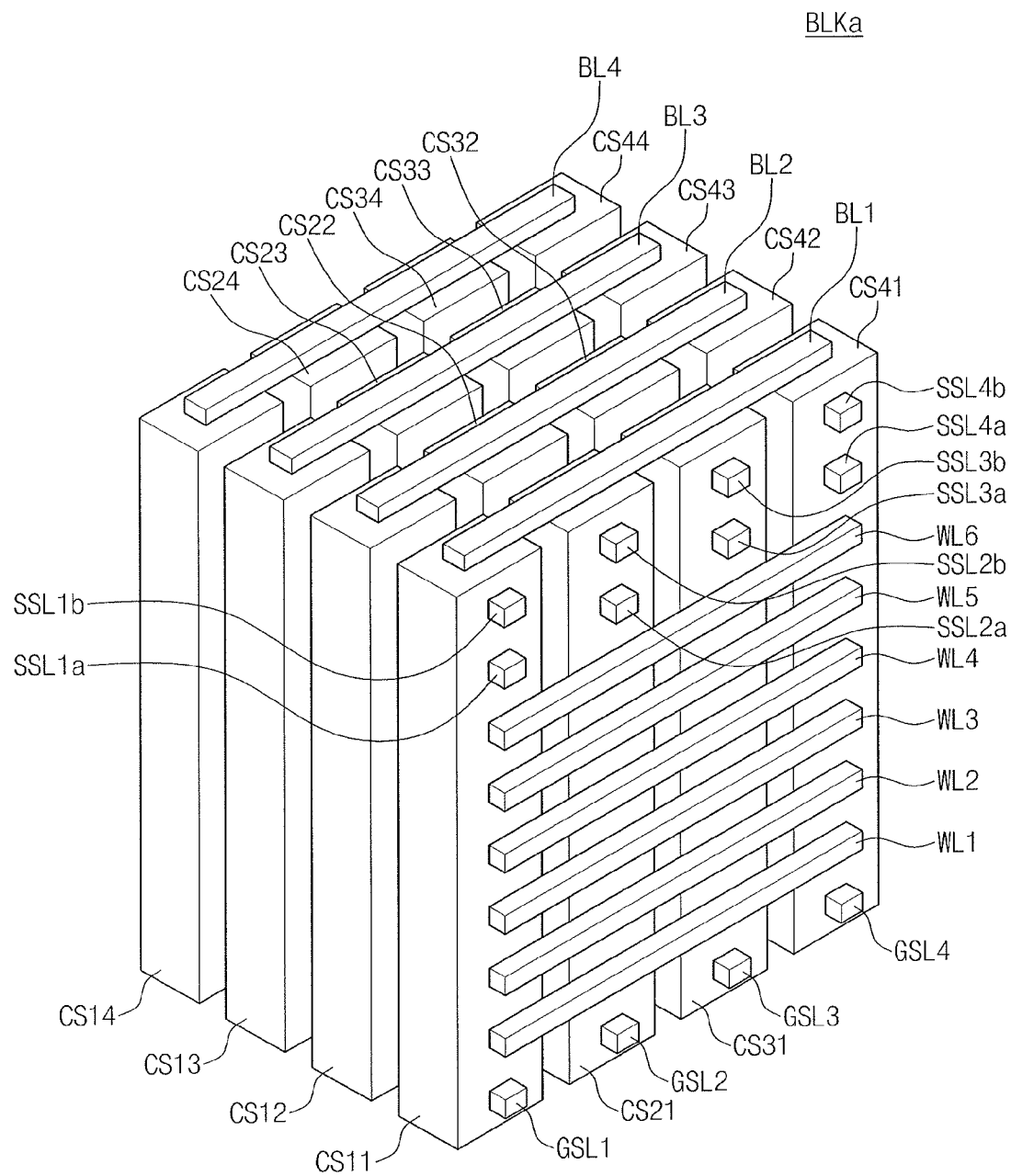
FIG. 5 illustrates an extension example of a memory block.

FIG. 5 illustrates an extension example of the memory block BLKa of FIG. 2. Referring to FIGS. 1 and 5, cell strings (CS11~CS14, CS21~CS24, CS31~CS34, CS41~CS44) are provided to the memory block BLKa. The cell strings CS11~CS14 of a first row may be connected to first string select lines (SSL1*a*, SSL1*b*) and a first ground select line GSL1. The cell strings CS21~CS24 of a second row may be connected to second string select lines (SSL2*a*, SSL2*b*) and a second ground select line GSL2. The cell strings CS31~CS34 of a third row may be connected to third string select lines (SSL3*a*, SSL3*b*) and a third ground select line GSL3. The cell strings CS41~CS44 of a fourth row may be connected to fourth string select lines (SSL4*a*, SSL4*b*) and a fourth ground select line GSL4.

Cell strings CS11~CS41 of a first column may be connected to a first bit line BL1. Cell strings CS12~CS42 of a second column may be connected to a second bit line BL2. Cell strings CS13~CS43 of a third column may be connected to a third bit line BL3. Cell strings CS14~CS44 of a fourth column may be connected to a fourth bit line BL4. The cell strings (CS11~CS14, CS21~CS24, CS31~CS34, CS41~CS44) may be connected to the word lines WL1~WL6 respectively.

Figure 6:
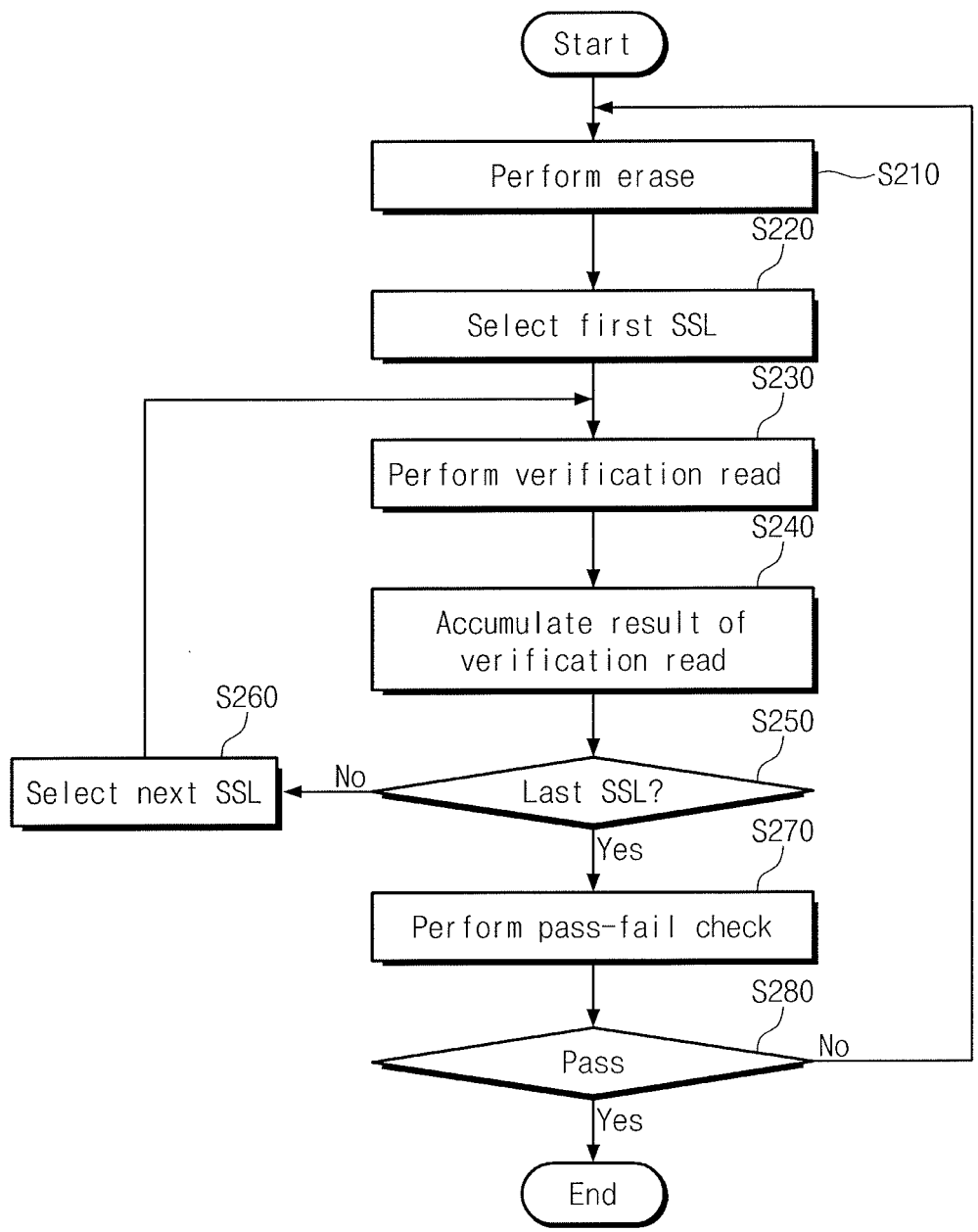
FIG. 6 illustrates an application example of a read operation.

FIG. 6 illustrates an application example of a read operation described with reference to FIG. 4. As an example, the read operation of FIG. 4 corresponds to a verify read of each erase loop of an erase operation in FIG. 6.

Referring to FIGS. 1, 2, 3, 5 and 6, the nonvolatile memory device 110 performs an erase operation in operation S210. For example, an erase voltage may be applied to bodies of memory cells MC of the cell strings (CS11~CS14, CS21~CS24, CS31~CS34, CS41~CS44). The row decoder circuit 113 may float the string select lines (SSL1*a*~SSL4*a*, SSL1*b*~SSL4*b*) and the ground select lines GSL1~GSL4 and apply word line erase voltages to the word lines WL1~WL6. The word line erase voltages may be a ground voltage or low voltages having a level similar to the ground voltage.

In operation S220, the nonvolatile memory device 110 selects a first string select line. For example, the nonvolatile memory device 110 may select the first string select line (SSL1*a* or SSL1*b*) among the string select lines (SSL1*a*~SSL4*a* or SSL1*b*~SSL4*b*) at the same height.

In operation S230, the nonvolatile memory device 110 performs a verify-read operation. The verify-read operation may proceed in the order of a precharge, develop, and a latch. During the precharge time, the page buffer circuit 115 may float the bit lines BL1~BL4 after charging the bit lines BL1~BL4 with a power supply voltage. During the develop time, the row decoder circuit 113 may apply a turn-on voltage to the select lines (SSL1*a*, SSL1*b*, GSL1) associated with the selected string select line (SSL1*a* or SSL1*b*) and may apply an erase verify voltage to the word lines WL1~WL6. The turn-on voltages may be voltages that turn on the select transistors (SSTa, SSTb, GST). The erase verify voltage may correspond to an upper limit target value of threshold voltages which memory cells of an erase state have. During the latch time, the page buffer circuit 115 may set values of the sense latches SL according to voltages of the bit lines BL1~BL4. The values set in the sense latches SL may be a result of the verify-read operation.

In operation S240, the nonvolatile memory device 110 accumulate the result of the verify-read operation. For example, the page buffer circuit 115 may perform a dump operation that updates the data latch (e.g., DL1) among the data latches DL1~DL3 according to the value of the sense latch SL in relation to each bit line.

In operation S250, a determination is made as to whether the selected string select line is the last string select line. For example, it may be determined whether verify read operations are performed with respect to all the memory cells MC that belong to the memory block BLKa. If the selected string select line is not the last string select line, a next string is selected in operation S260. After that, the nonvolatile memory device 110 may perform operation S230 again. If the selected string select line is the last string select line, an operation S270 is performed.

In operation S270, the nonvolatile memory device 110 performs a pass/fail check. For example, the page buffer circuit 115 may output the result of the verify-read operation accumulated in the data latch DL1 to the pass/fail check circuit (PFC). The pass/fail check circuit (PFC) may determine a pass or a fail according to the accumulated result of the verify-read operation. For example, if the number of bits having a first value among the accumulated result of the verify-read operation is greater than a critical value, the pass/fail check circuit (PFC) may determine a fail. If a fail is determined, the nonvolatile memory device 110 may perform a next erase loop from operation S210. If the number of bits having a first value among the accumulated result of the verify-read operation is less than a critical value, the pass/fail check circuit (PFC) may determine a pass. If a pass is determined, the nonvolatile memory device 110 may finish an erase operation.

Figure 7:
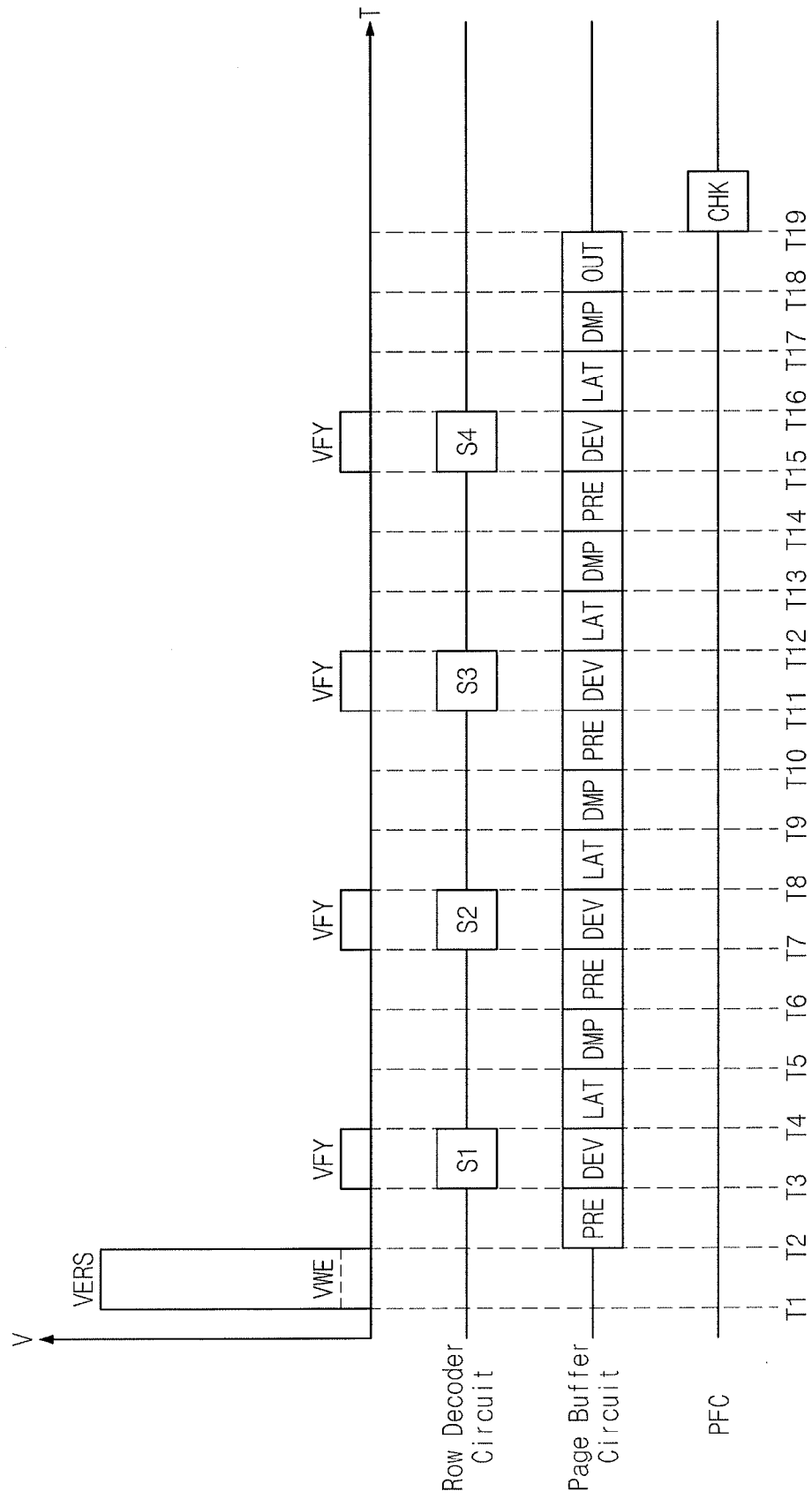
FIG. 7 illustrates an example of a timing diagram for voltages applied to memory cells and operations performed for a nonvolatile memory device during a single erase loop.
Figures 8, 9:
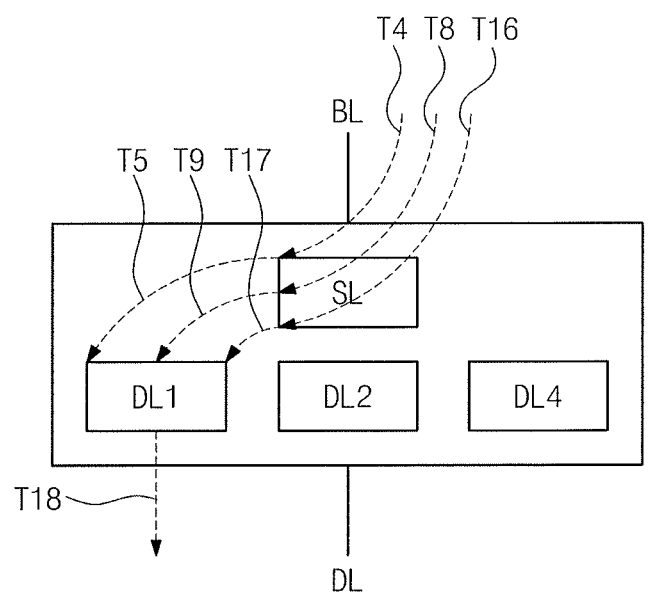
FIG. 8 illustrates an example of an operation for a page buffer during an erase loop.
FIG. 9 illustrates an example of accumulated for verify read operations.

FIG. 7 illustrates an example of a timing diagram for voltages applied to memory cells and operations performed in each circuit of a nonvolatile memory device while a single erase loop is performed. In FIG. 7, a horizontal axis indicates time (T) and a vertical axis indicates a voltage and operations of circuits of the nonvolatile memory device 110. FIG. 8 illustrates an example of an operation performed in a page buffer circuit 115 while an erase loop of FIG. 7 is performed.

Referring to FIGS. 1 through 3, and 5 through 8, an erase operation (operation S210) is performed at a first time (T1). An erase voltage VERS may be applied to bodies of memory cells MC and word line erase voltages VWE may be applied to control gates.

A verify-read operation is performed with respect to the first string line (SSL1a or SSL1b) during a second time (T2) through a sixth time (T6). The page buffer circuit 115 may perform a precharge PRE during the second time (T2). The page buffer circuit 115 may float the bit lines BL1~BL4 after charging the bit lines BL1~BL4 with a power supply voltage. The page buffer circuit 115 performs a develop DEV at a third time (T3). For example, the page buffer circuit 115 may standby during a predetermined time. The row decoder circuit 113 may perform a first selection S1 selecting the first string select line (SSL1a or SSL1b). The row decoder circuit 113 may apply turn-on voltages to select lines (SSL1a, SSL1b, GSL1) associated with the selected string line (SSL1a or SSL1b). The row decoder circuit 113 may apply erase verify voltages VFY to the memory cells MC through the word lines WL1~WL6.

The page buffer circuit 115 performs a latch LAT at a fourth time (T4). As illustrated by an arrow in FIG. 8, the page buffer circuit 115 may set values of the sense latches SL according to voltages of the bit lines BL1~BL4. The page buffer circuit 115 performs a dump operation DMP at a fifth time (T5). The page buffer circuit 115 may update the data latches DL1 according to the values of the sense latches SL.

A verify-read operation is performed with respect to the second string select line (SSL2a or SSL2b) through a second selection S2 during a sixth time (T6) through a tenth time (T10). The page buffer circuit 115 may perform a precharge PRE at the sixth time (T6). The page buffer circuit 115 may perform a develop DEV at the seventh time (T7). The page buffer circuit 115 may perform a latch LAT at the eighth time (T8). As illustrated by an arrow in FIG. 8, the page buffer circuit 115 may set values of the sense latches SL according to voltages of the bit lines BL1~BL4. The page buffer circuit 115 performs a dump operation DMP at a ninth time (T9). The page buffer circuit 115 may update the data latches DL1 according to the values of the sense latches SL.

A verify-read operation is performed with respect to the third string select line (SSL3a or SSL3b) through a third selection S3 during a tenth time (T10) through a fourteenth time (T14). The page buffer circuit 115 may perform a precharge PRE at the tenth time (T10). The page buffer circuit 115 may perform a develop DEV at the eleventh time (T11). The page buffer circuit 115 may perform a latch LAT at the twelfth time (T12). As illustrated by an arrow in FIG. 8, the page buffer circuit 115 may set values of the sense latches SL according to voltages of the bit lines BL1~BL4. The page buffer circuit 115 performs a dump operation DMP at a thirteenth time (T13). The page buffer circuit 115 may update the data latches DL1 according to the values of the sense latches SL.

A verify-read operation is performed with respect to the fourth string select line (SSL4a or SSL4b) through a fourth selection S4 during a fourteenth time (T14) through an eighteenth time (T18). The page buffer circuit 115 may perform a precharge PRE at the fourteenth time (T14). The page buffer circuit 115 may perform a develop DEV at the fifteenth time (T15). The page buffer circuit 115 may perform a latch LAT at the sixteenth time (T16). As illustrated by an arrow in FIG. 8, the page buffer circuit 115 may set values of the sense latches SL according to voltages of the bit lines BL1~BL4. The page buffer circuit 115 performs a dump operation DMP at a seventeenth time (T17). The page buffer circuit 115 may update the data latches DL1 according to the values of the sense latches SL.

Verify-read operations with respect to the memory cells MC of the memory block BLKa are completed, the page buffer circuit 115 may output the accumulated result of the verify-read operations. As illustrated by an arrow in FIG. 8, the page buffer circuit 115 may output values stored in the data latches DL1 to the pass/fail check circuit (PFC) as the accumulated result of the verify-read operations.

The pass/fail check circuit (PFC) may perform a pass/fail check CHK at a nineteenth time (T19).

FIG. 9 illustrates an example of accumulated results of verify read operations. Referring to FIGS. 5 and 9, in the first bit line BL1, results of verify read operations associated with the first through fourth string select lines SSL1a~SSL4a may all indicate a pass (P). At this time, the accumulated result may indicate a pass (P). In the second bit line BL2, results of verify read operations associated with the first through third string select lines SSL1a~SSL3a may indicate a pass (P) and a result of verify read operation associated with the fourth string select line SSL4a may indicate a fail (F). At this time, the accumulated result may indicate a fail (F).

In the third bit line BL3, results of verify read operations associated with the first and second string select lines (SSL1a, SSL2a) may indicate a pass (P) and results of verify read operations associated with the third and fourth string select lines (SSL3a, SSL4a) may indicate a fail (F). At this time, the accumulated result may indicate a fail (F). In the fourth bit line BL4, a result of verify read operation associated with the first string select line SSL1a may indicate a pass (P) and results of verify read operations associated with the second through fourth string select lines SSL2a~SSL4a may indicate a fail (F). At this time, the accumulated result may indicate a fail (F).

For example, while the verify-read operations are performed, if at least one result of the verify-read operation indicates a fail (F), an accumulated result associated with a corresponding bit line may indicate a fail (F). While the verify-read operations are performed, if results of the verify-read operations all indicate a pass (P), an accumulated result associated with a corresponding bit line may indicate a pass (P).

For example, the nonvolatile memory device 110 may have a first operation mode in which the nonvolatile memory device 110 performs a verification read and a pass-fail check for each plane. The nonvolatile memory device 110 may have a second operation mode in which the nonvolatile memory device 110 performs verification reads of entire planes of the memory block BLKa and then performs a pass-fail check once.

For example, if reliability of the nonvolatile memory device 110 is high, the nonvolatile memory device 110 may operate in the second operation mode. If the nonvolatile memory device 110 wears out and is unreliable, the nonvolatile memory device 110 may operate in the first operation mode.

For example, pass or fail may be determined by comparing the verification read result with the first critical value in the first operation mode. Pass or fail may be determined by comparing the verification read result with the second critical value. The second critical value may greater than the first critical value. The first critical value and the second critical value may be the numbers of on cells (e.g., failed cells) or off cells (e.g., passed cells). For example, the second critical value may be greater than the first critical value m-times, where m is the number of planes or a similar value.

Figure 10:
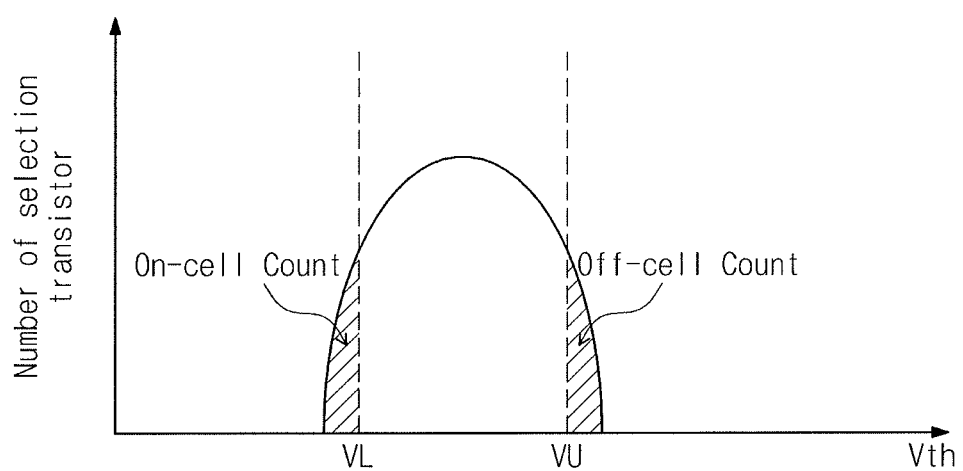
FIG. 10 illustrates an example of a pass/fail check read operation.

FIG. 10 illustrates an embodiment corresponding to a pass-fail check read performed by selection transistors. In FIG. 10, the horizontal axis indicates threshold voltages Vth of the selection transistors and the vertical axis indicates the number of the selection transistors. Referring FIGS. 1, 2, 3, 5, and 10, the string selection transistors SSTa or SSTb or the ground selection transistors GST may have the same structure with memory cells. For example, the string selection transistors SSTa or SSTb or the ground selection transistors GST may have the threshold voltage Vth. The threshold voltages of the string selection transistors SSTa or SSTb or the ground selection transistors GST may be controlled within a certain range for normal read, write, or erase operations of the memory cells MC. For example, the threshold voltage Vth of the string selection transistors SSTa or SSTb or the ground selection transistors GST may be controlled below a upper limit voltage VU and above a lower limit voltage VL.

During programming, read and erase operations are performed in the nonvolatile memory device 110 and threshold voltages of the string select transistors (SSTa or SSTb) or the ground select transistors GST may be increased by disturbance. For example, the threshold voltages of the string select transistors (SSTa or SSTb) or the ground select transistors GST may become greater than an upper limit voltage VU by a disturbance.

As time goes by after the threshold voltages of the string select transistors (SSTa or SSTb) or the ground select transistors GST are controlled, the threshold voltages of the string select transistors (SSTa or SSTb) or the ground select transistors GST may become low. For example, the threshold voltages of the string select transistors (SSTa or SSTb) or ground select transistors GST may become less than a lower limit voltage VL.

If the threshold voltages of the string select transistors (SSTa or SSTb) or the ground select transistors GST become less than the lower limit voltage VL or greater than the upper limit voltage VU, an incorrect operation may occur in the nonvolatile memory device 110. To prevent an incorrect operation from occurring in the nonvolatile memory device 110, a pass/fail check read operation may be performed.

For example, in a pass/fail check read operation, the nonvolatile memory device 110 may perform a read operation of the string select transistors (SSTa or SSTb) or the ground select transistors GST using the higher limit voltage VU and may perform an off-cell count that counts off-cells being turned off in a read operation. For example, in a pass/fail check read operation, the nonvolatile memory device 110 may perform a read operation of the string select transistors (SSTa or SSTb) or the ground select transistors GST using the lower limit voltage VL and may perform an on-cell count that counts on-cells being turned on in a read operation.

Figure 11:
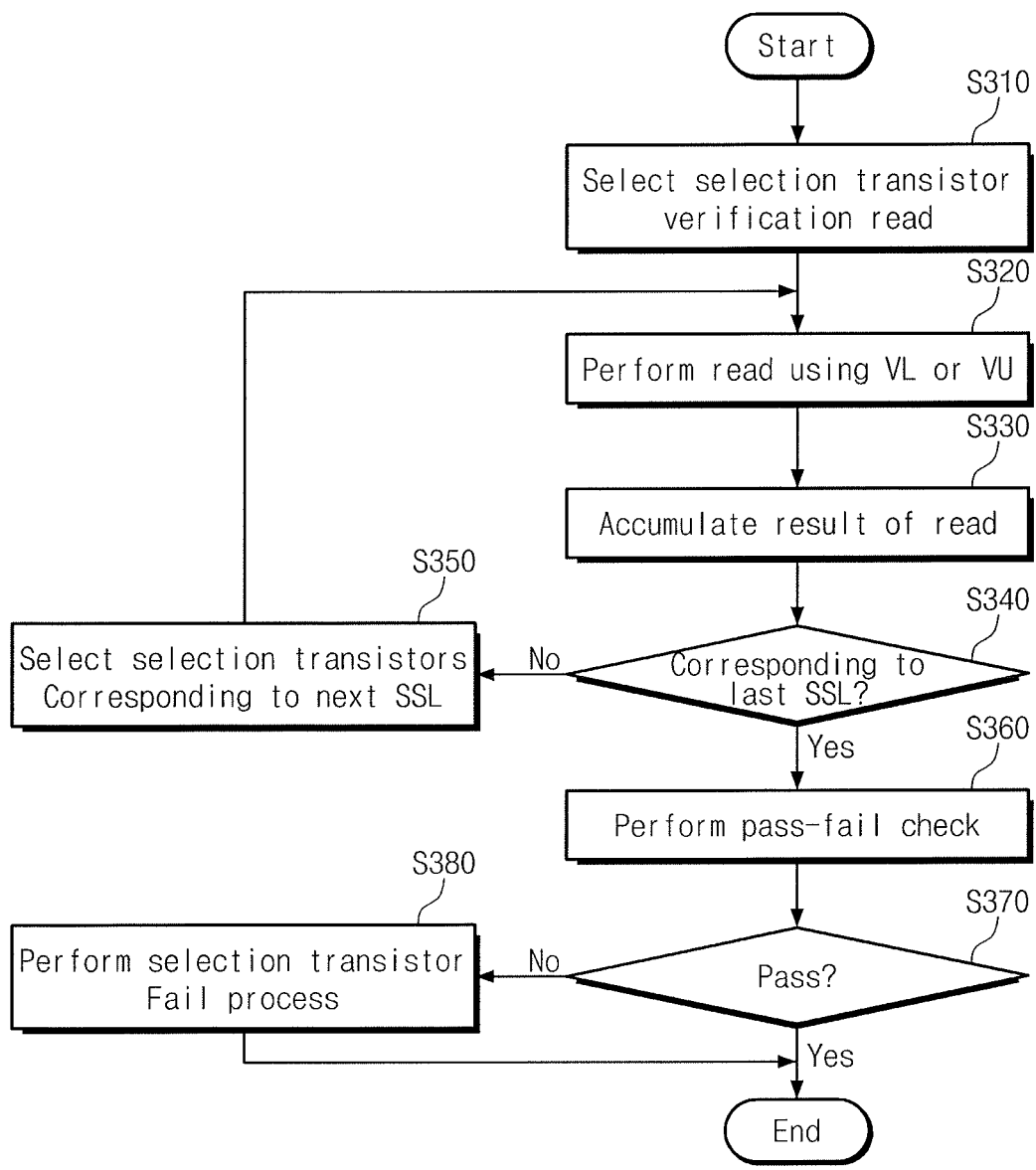
FIG. 11 illustrates an application example of a read operation.

FIG. 11 illustrates an application example of the read operation of FIG. 4 applied to a pass/fail check read of select transistors. Referring to FIGS. 1, 2, 3, 5, 10, and 11, in operation S310 the nonvolatile memory device 110 may select selection transistors corresponding to a first string select line. For example, the nonvolatile memory device 110 may select the string select transistors (SSTa or SSTb) or the ground select transistors GST corresponding to the first string select line (SSL1a or SSL1b) among the string select lines (SSL1a~SSL4a or SSL1b~SSL4b) at the same height.

In operation S320, the nonvolatile memory device 110 performs a read operation with respect to selected select transistors using the lower limit voltage VL or the upper limit voltage VU. The read operation may proceed in the order of precharge, develop, and latch. During the precharge time, the page buffer circuit 115 may float the bit lines BL1~BL4 after charging the bit lines BL1~BL4 with a power supply voltage. During the develop time, the row decoder circuit 113 may apply the lower limit voltage VL or the upper limit voltage VU to a selected select line connected to the selected string select transistors and may apply turn-on voltages to unselected select lines and the word lines connected to the unselected select transistors. The turn-on voltages may be voltages that turn on the select transistors and the memory cells MC. During the latch time, the page buffer circuit 115 may set values of the sense latches SL according to voltages of the bit lines BL1~BL4.

In operation S330, the nonvolatile memory device 110 may accumulate a result of the read operation. For example, the page buffer circuit 115 may update the data latches DL1 according to the values of the sense latches SL.

In operation S340, the nonvolatile memory device 110 determines whether selected select transistors correspond to the last string select line. For example, the nonvolatile memory device 110 may determine whether pass/fail check read operations are completed with respect to the whole string select transistors (SSTa or SSTb) or the ground select transistors GST. For example, the nonvolatile memory device 110 may determine whether pass/fail check read operations are completed with respect to some select transistors which are check targets among the string select transistors (SSTa or SSTb) or the ground select transistors GST.

If the pass/fail check read operation is not completed, in operation S350, the nonvolatile memory device 110 may select selection transistors corresponding to a next string select line. If the pass/fail check read operation is completed, operation S360 is performed.

In operation S360, the nonvolatile memory device 110 may perform a pass/fail check operation. For example, when the pass/fail check read operation is performed using the lower limit voltage VL, the pass/fail check circuit (PFC) may perform an on-cell count and compare a count result with a critical value. When the pass/fail check read operation is performed using the higher limit voltage VU, the pass/fail check circuit (PFC) may perform an off-cell count and compare a count result with a critical value.

In operation S370, the nonvolatile memory device 110 determines a pass or a fail. For example, if the count result is less than the critical value, the pass/fail check circuit (PFC) may determine a pass. If a pass is determined, the pass/fail check read operation may be finished. If the count result is greater than the critical value, the pass/fail check circuit (PFC) may determine a fail. If a fail is determined, in operation S380, the nonvolatile memory device 110 may perform a select transistor fail process. For example, the select transistor fail process may include an operation of adjusting threshold voltages of the select transistors and an operation of setting the memory block BLKa as a bad block.

Figure 12:
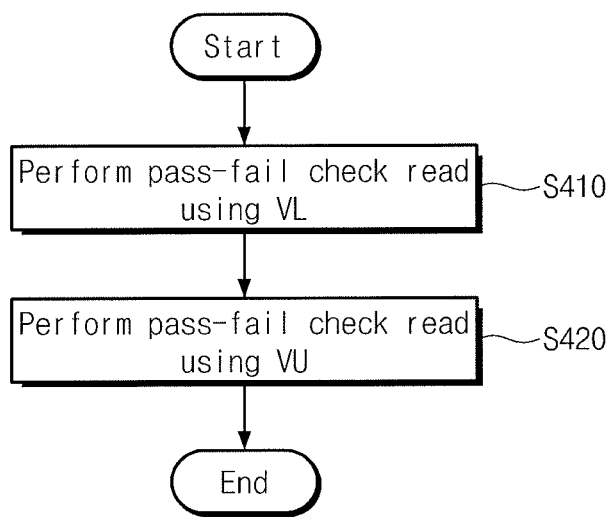
FIG. 12 illustrates another example of a pass/fail check read operation.

FIG. 12 illustrates an application example of a pass/fail check read operation with reference to FIG. 11. Referring to FIGS. 1, 2, 3, 5, 10, and 12, in operation S410, the nonvolatile memory device 110 may perform a pass/fail check read operation using the lower limit voltage VL. The pass/fail check read operation may be performed according to the method of FIG. 11. After performing the pass/fail check read operation using the lower limit voltage VL, in operation S420, the nonvolatile memory device 110 may perform a pass/fail check read operation using the upper limit voltage VU. The pass/fail check read operation may be performed according to the method described with reference to FIG. 11. For example, pass/fail check read operations may be sequentially performed with respect to the string select transistors (SSTa or SSTb) or the ground select transistors GST using the lower limit voltage VL and the upper limit voltage VU.

Figure 13:
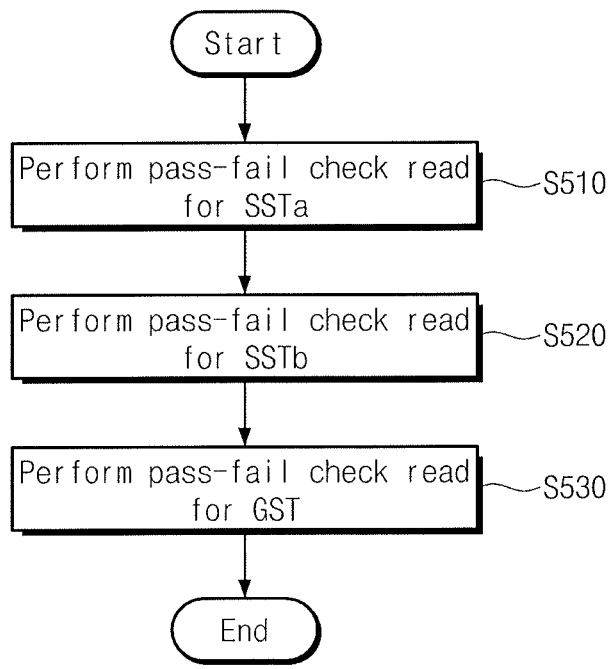
FIG. 13 illustrates another example of a pass/fail check read operation.

FIG. 13 illustrates another application example of a pass/fail check read operation relating to FIG. 11. Referring to FIGS. 1, 2, 3, 5, 10, and 13, in operation S510, the nonvolatile memory device 110 may perform a pass/fail check read operation with respect to the string select transistors SSTa. The pass/fail check read operation may be performed using the lower limit voltage VL and the upper limit voltage VU according to the method of FIG. 11. In operation S520, the nonvolatile memory device 110 may perform a pass/fail check read operation with respect to the string select transistors SSTb. The pass/fail check read operation may be performed using the lower limit voltage VL and the upper limit voltage VU according to the method of FIG. 11. In operation S530, the nonvolatile memory device 110 may perform a pass/fail check read operation with respect to the ground select transistors GST. The pass/fail check read operation may be performed using the lower limit voltage VL and the upper limit voltage VU according to the method of FIG. 11. For example, pass/fail check read operations may be sequentially performed with respect to select transistors of different heights that belong to the memory block BLKa.

Figure 14:
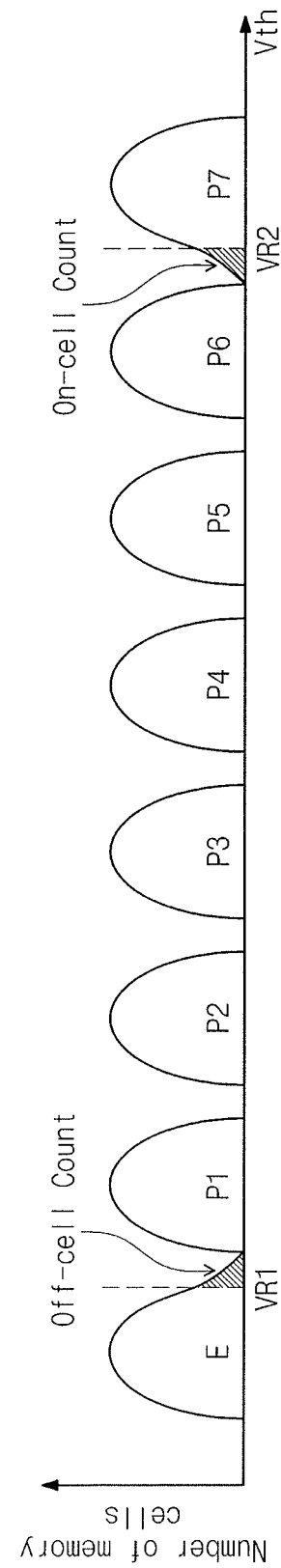
FIG. 14 illustrates an example of a reliability test read operation.

FIG. 14 illustrates an example of a reliability test read operation performed for memory cells. In FIG. 14, the horizontal axis indicates threshold voltages Vth of memory cells MC and the vertical axis indicates the number of the memory cells MC. Referring to FIGS. 1, 2, 3, 5, and 14, the memory cells MC may be programmed to have an erase state E and first through seventh program states P1~P7.

While program, read, and erase operations are performed in the nonvolatile memory device 110, threshold voltages of the memory cells MC may be increased by disturbance. For example, threshold voltages of memory cells having the erase state E may increase the most.

As time goes by after the memory cells MC are programmed, threshold voltages of the memory cells MC may become low. For example, a reduction in threshold voltages of memory cells having the seventh program state P7 may be to a greatest extent.

If threshold voltages of memory cells of the erase state E increase or threshold voltages of memory cells of the seventh program state P7 decrease, a read error may occur in a read operation. To prevent a read error from occurring, a reliability test read operation may be performed.

For example, in the reliability test read operation, the nonvolatile memory device 110 may perform a read operation with respect to memory cells MC using a first read voltage VR1 and may perform an off-cell count that counts the number of off-cells having a threshold voltage higher than the first read voltage VR1 among memory cells programmed to the erase state E. The nonvolatile memory device 110 may perform an on-cell count that counts the number of on-cells having a threshold voltage lower than the first read voltage VR1 among memory cells programmed to the erase state E and estimate a result of the off-cell count according to a result of the on-cell count.

For example, in the reliability test read operation, the nonvolatile memory device 110 may perform a read operation with respect to memory cells MC using a second read voltage VR2 and may perform an on-cell count that counts the number of on-cells having a threshold voltage lower than the second read voltage VR2 among memory cells programmed to the seventh program state P7. The nonvolatile memory device 110 may perform an off-cell count that counts the number of off-cells having a threshold voltage higher than the second read voltage VR2 among memory cells programmed to the seventh program state P7 and may estimate a result of the on-cell count according to a result of the off-cell count.

Figure 15:
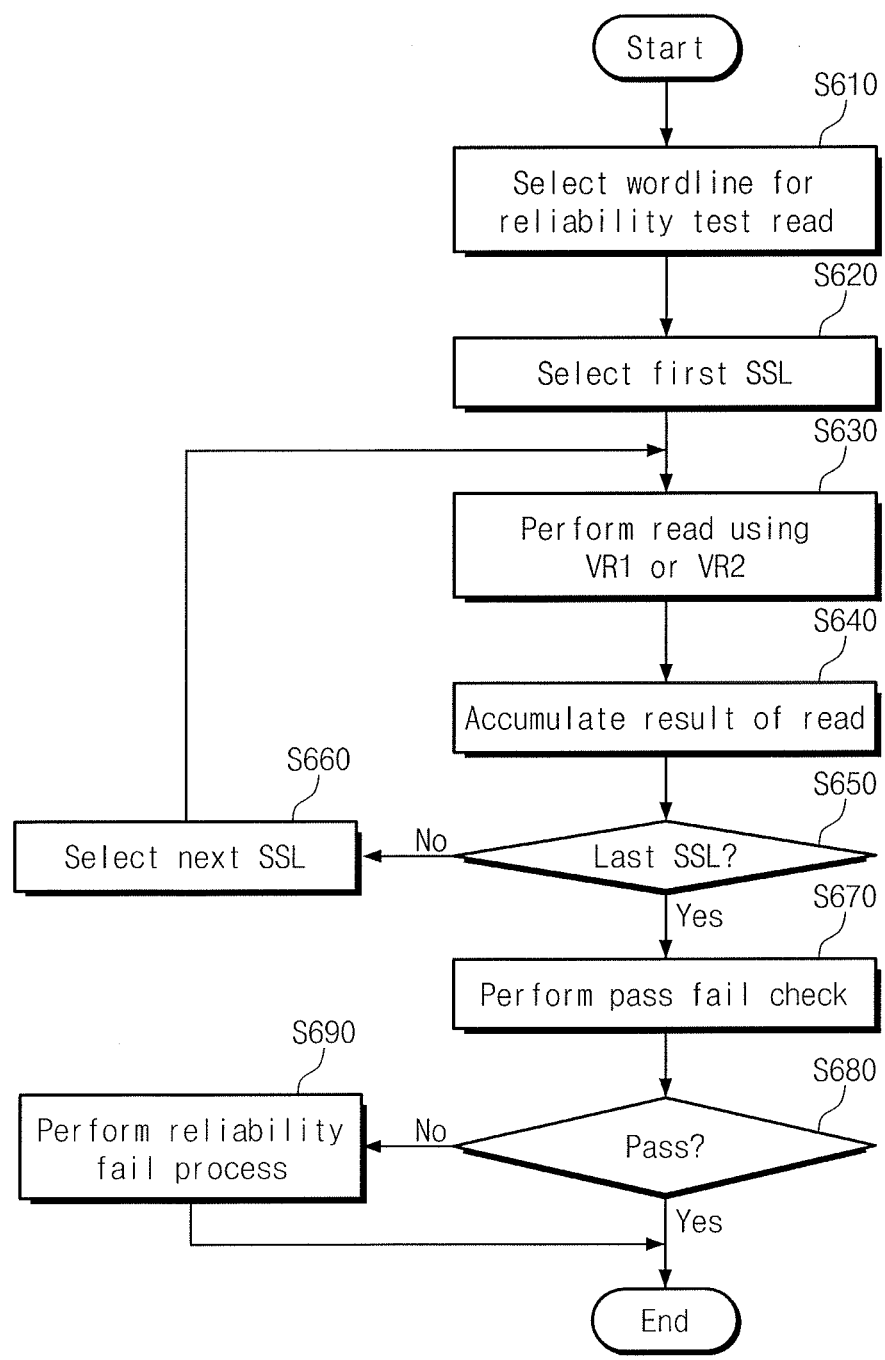
FIG. 15 illustrates another application example of a read operation.

FIG. 15 illustrates another application example of a read operation applied to a reliability test read operation of the memory cells MC. Referring to FIGS. 1, 2, 3, 5, 14, and 15, in operation S610, the nonvolatile memory device 110 may select a word line that will perform a reliability test read operation.

In operation S620, the nonvolatile memory device 110 may select a first string select line. For example, the nonvolatile memory device 110 may select the first select line (SSL1*a* or SSL1*b*) among the string select lines (SSL1*a*~SSL4*a* or SSL1*b*~SSL4*b*) at the same height.

In operation S630, the nonvolatile memory device 110 may perform a read operation using the first read voltage VR1 or the second read voltage VR2. The read operation may proceed in the order of precharge, develop, and latch. During the precharge time, the page buffer circuit 115 may float the bit lines BL1~BL4 after charging the bit lines BL1~BL4 with a power supply voltage. During the develop time, the row decoder circuit 113 may apply a turn-on voltage to the string select lines (SSL1*a*, SSL1*b*) corresponding to a selected string select line and a ground select line GSL1, may apply a turn-on voltage to unselected word lines, and may apply the first read voltage VR1 or the second read voltage VR2 to a selected word line. During the latch time, the page buffer circuit 115 may set values of the sense latches SL according to voltages of the bit lines BL1~BL4.

In operation S640, the nonvolatile memory device 110 may accumulate a result of the read operation. For example, the page buffer circuit 115 may update the data latches DL1 according to the values of the sense latches SL.

In operation S650, the nonvolatile memory device 110 determines whether the selected string select line is the last string select line. For example, the nonvolatile memory device 110 may determine whether reliability test read operations are completed with respect to the whole string select lines (SSL1*a*~SSL4*a* or SSL1*b*~SSL4*b*). For example, the nonvolatile memory device 110 may determine whether reliability test read operations are completed with respect to some select lines which are check targets among the string select lines (SSL1*a*~SSL4*a* or SSL1*b*~SSL4*b*).

If the reliability test read operations are not completed, in operation S660, the nonvolatile memory device 110 may select a next string select line. If the reliability test read operations are completed, operation S670 is performed.

In operation S670, the nonvolatile memory device 110 may perform a pass/fail check operation. For example, when the reliability test read operation is performed using the first read voltage VR1, the pass/fail check circuit (PFC) may perform an off-cell count and compare a count result with a critical value. When the reliability test read operation is performed using the second read voltage VR2, the pass/fail check circuit (PFC) may perform an on-cell count and compare a count result with the critical value.

In operation S680, the nonvolatile memory device 110 determines a pass or a fail. For example, if the count result is less than the critical value, the pass/fail check circuit (PFC) may determine a pass. If a pass is determined, the reliability test read operation may be finished. If the count result is greater than the critical value, the pass/fail check circuit (PFC) may determine a fail. If a fail is determined, in operation S690, the nonvolatile memory device 110 may perform a reliability fail process. For example, the reliability fail process may include a refresh operation in which data is read from the memory cells MC of the memory block BLKa and the read data is programmed in other memory block.

Figure 16:
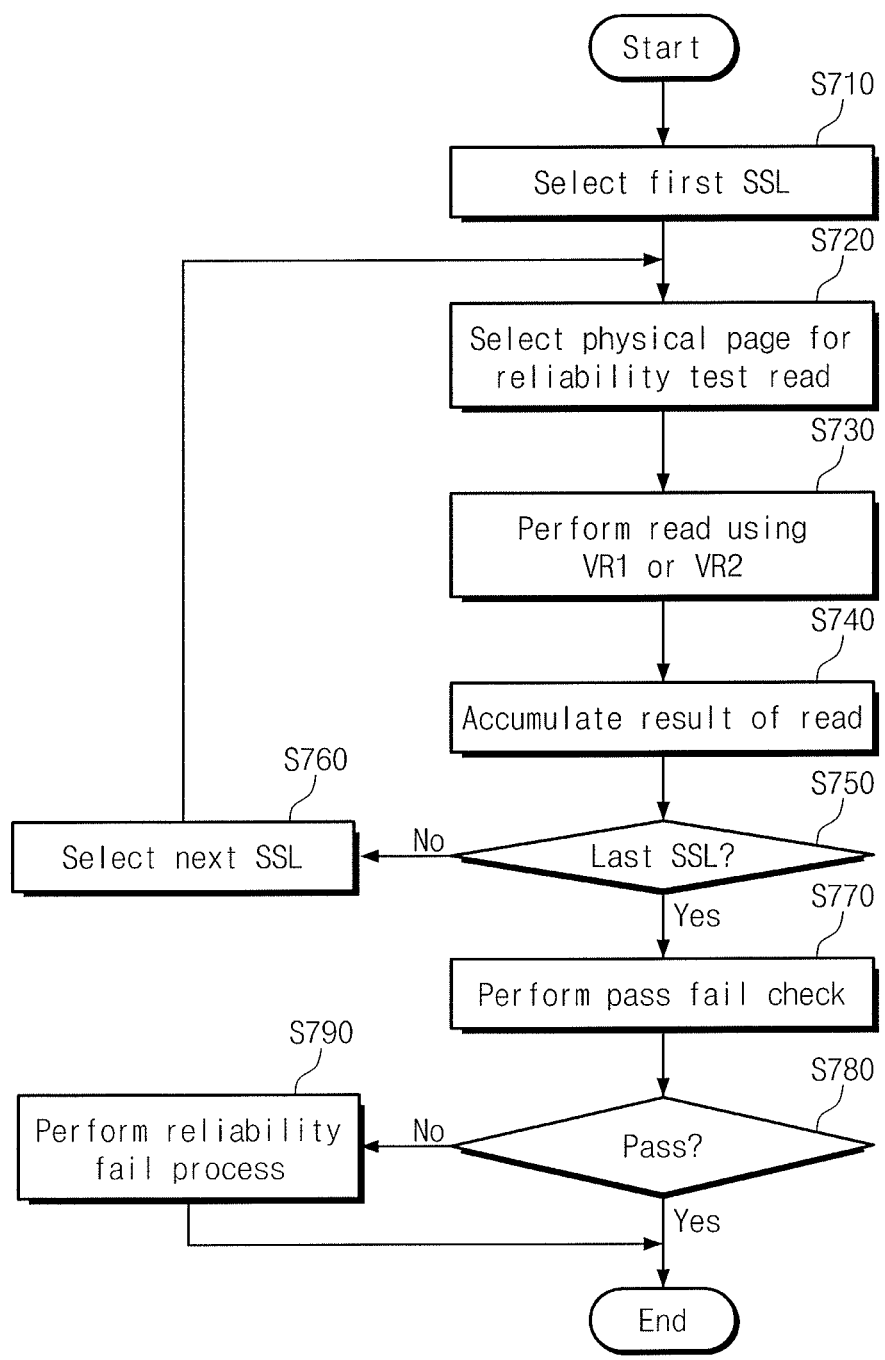
FIG. 16 illustrates another application example of a read operation.

FIG. 16 illustrates another application example of a read operation applied to a reliability test read operation of the memory cells MC. Referring to FIGS. 1, 2, 3, 5, 14, and 16, in operation S710, the nonvolatile memory device 110 may select a first string select line. For example, the nonvolatile memory device 110 may select the first string select line (SSL1*a* or SSL1*b*) among the string select lines (SSL1*a*~SSL4*a*, SSL1*b*~SSL4*b*) at the same height.

In operation S720, the nonvolatile memory device 110 may select a physical page for performing a reliability test read operation.

In operation S730, the nonvolatile memory device 110 may perform a read operation using the first read voltage VR1 or the second read voltage VR2. The read operation may proceed in the order of precharge, develop, and latch.

In operation S740, the nonvolatile memory device 110 may accumulate a result of the read operation. For example, the page buffer circuit 115 may update the data latches DL1 according to values of the sense latches SL.

In operation S750, the nonvolatile memory device 110 may determine whether the selected string select line is the last string select line. For example, the nonvolatile memory device 110 may determine whether reliability test read operations are completed with respect to the whole string select lines (SSL1*a*~SSL4*a* or SSL1*b*~SSL4*b*). For example, the nonvolatile memory device 110 may determine whether reliability test read operations are completed with respect to some select lines which are check targets among the string select lines (SSL1*a*~SSL4*a* or SSL1*b*~SSL4*b*).

If the reliability test read operations are not completed, in operation S760, the nonvolatile memory device 110 may select a next string select line. If the reliability test read operations are completed, operation S770 is performed.

In the operation S770, the nonvolatile memory device 110 may perform a pass/fail check operation. In operation S780, the nonvolatile memory device 110 determines a pass or a fail. For example, if a count result is less than a critical value, the pass/fail check circuit (PFC) may determine a pass. If a pass is determined, a reliability test read operation may be finished. If the count result is greater than the critical value, the pass/fail check circuit (PFC) can determine a fail. If a fail is determined, in operation S790, the nonvolatile memory device 110 may perform a reliability fail process.

In comparison with the operation method of FIG. 15, in FIG. 16 the nonvolatile memory device 110 may perform a reliability test read operation with respect to different physical pages from one another when sequentially selecting the string select lines (SSL1*a*~SSL4*a* or SSL1*b*~SSL4*b*).

Figure 17:
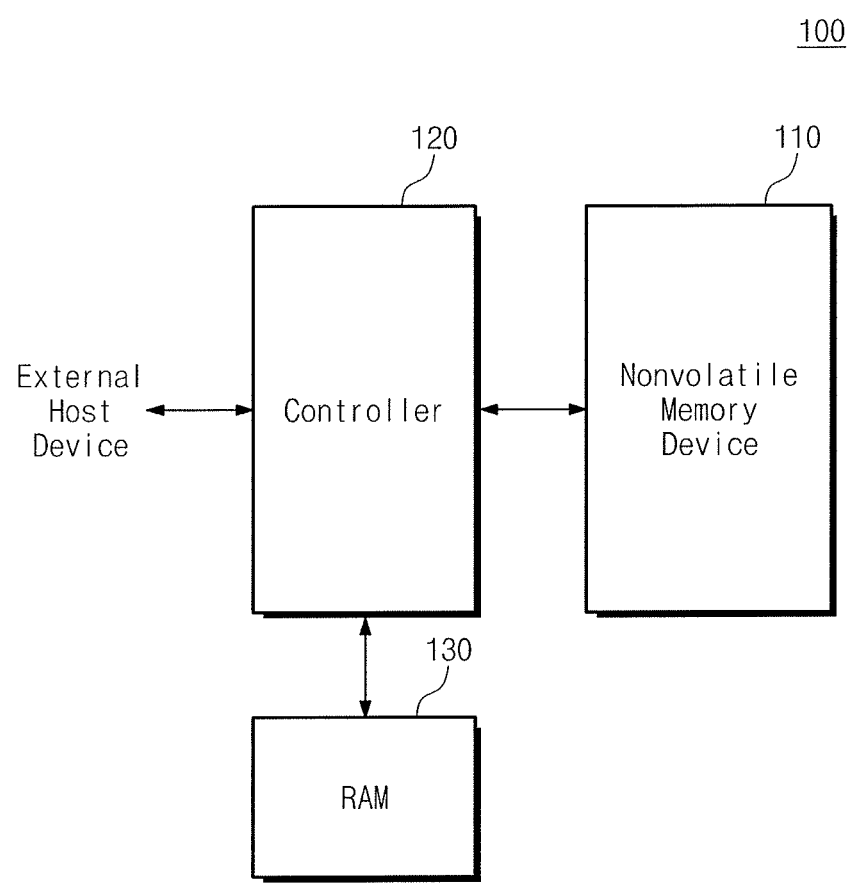
FIG. 17 illustrates an embodiment of a storage device.

FIG. 17 illustrates an embodiment of a storage device 100 which includes a nonvolatile memory device 110, a controller 120, and a RAM 130. The nonvolatile memory device 110 may operate according to the methods with reference to FIGS. 1 through 16. For example, the nonvolatile memory device 110 may perform an erase operation according to the method of FIG. 6, may perform a pass/fail check read operation according to the method of FIG. 11, or may perform a reliability test read operation according to the method with reference to FIG. 15 or 16. Thus, operation speed of the nonvolatile memory device 110 may be improved and operation speed of the storage device 100 may be improved.

The nonvolatile memory device 110 may perform write, read, and erase operations according to a control of the controller 120. The nonvolatile memory device 110 may receive a command and an address from the controller through an input/output channel. The nonvolatile memory device 110 may exchange data with the controller 120 through the input/output channel.

The nonvolatile memory device 110 may exchange a control signal with the controller through a control channel. For example, the nonvolatile memory device 110 may receive a chip enable signal /CE selecting at least one nonvolatile memory chip among a plurality of nonvolatile memory chips of the nonvolatile memory device 110, a command latch enable signal CLE indicating that a signal being received from the controller 120 through an input/output channel is a command, an address latch enable signal ALE indicating that a signal being received from the controller 120 through the input/output channel is an address, a read enable signal /RE that in a read operation, is generated by the controller 120 and is periodically toggled to be used to adjust timing, a write enable signal /WE being activated when a command or an address is transmitted, a write protection signal /WP being activated by the controller 120 to prevent an unwanted write or erase when a power supply is changed, and a data strobe signal DQS that in a write operation, is generated by the controller 120 and is periodically toggled to be used to adjust a sync of data being transmitted through the input/output channel from the controller 120. For example, the nonvolatile memory device 110 may output a ready & busy signal R/nB indicating that the nonvolatile memory device 110 is performing a program, erase, or read operation and a data strobe signal DQS generated from the read enable signal /RE by the nonvolatile memory device 110 and periodically toggled for adjusting an output sync of data to the controller 120.

The nonvolatile memory device 110 may include, for example, one or more of a flash memory or a nonvolatile memory such as a PRAM (phase-change RAM), a MRAM (magnetic RAM), a RRAM (resistive RAM), or a FeRAM (ferroelectric RAM).

The controller 120 may control the nonvolatile memory device 110. For example, the controller 120 may control the nonvolatile memory device 110 through the input/output channel and the control channel so that the nonvolatile memory device 110 performs a write, read, or erase operation.

The controller 120 may control the nonvolatile memory device 110 under the control of an external host device. For example, the controller 120 may communicate with the external host device according to a format different from a format being used when communicating with the nonvolatile memory device 110. A unit of data by which the controller 120 communicates with the nonvolatile memory device 110 may be different from a unit of data by which the controller 120 communicates with the external host device.

The controller 120 may use the RAM 130 as a buffer memory, a cache memory, or an operation memory. The controller 120 may store data and/or code for managing the nonvolatile memory device 110 in the RAM 130. For example, the controller 120 may read data and/or code for managing the nonvolatile memory device 110 from the nonvolatile memory device 110 and load them into the RAM 130. The RAM 130 may include at least one among various random access memory devices such as a DRAM (dynamic RAM), a SRAM (static RAM), a SDRAM (synchronous DRAM), a PRAM (phase-change RAM), a MRAM (magnetic RAM), a RRAM (resistive RAM), or a FeRAM (ferroelectric RAM).

The nonvolatile memory device 110 may include a plurality of nonvolatile memory chips. For example, the controller 120 and the nonvolatile memory chips may be connected to one another based on a channel and a way. One channel may include one data channel and one control channel. One channel may include one data channel and one control channel. One data channel may include, for example, eight data lines. One control channel may include control lines that transmit the chip enable signal /CE, the command latch enable signal CLE, the address latch enable signal ALE, the read enable signal /RE, the write enable signal /WE, the write protection signal /WP and the ready & busy signal R/nB described above.

Nonvolatile memory chips connected to one channel may form a way. If n number of nonvolatile memory chips is connected to one channel, an n-way may be formed. Nonvolatile memory chips that belong to one way may share data lines and control lines that transmit the command latch enable signal CLE, the address latch enable signal ALE, the read enable signal /RE, the write enable signal /WE, and the write protection signal /WP. Each of nonvolatile memory chips that belong to one way may communicate with the controller 120 through control lines only for transmitting the chip enable signal /CE and the ready & busy signal R/nB.

The controller 120 may alternately access nonvolatile memory chips of n-way connected to one channel. The controller 120 may independently access nonvolatile memory chips connected to different channels from one another. The controller 120 may alternately or concurrently access nonvolatile memory chips connected to different channels from one another.

The nonvolatile memory chips may be connected to the controller 120 in the form of wide I0. For example, nonvolatile memory chips connected to different channels from one another may share a control line of one chip enable signal /CE. Nonvolatile memory chips that share a control line of one chip enable signal /CE may be accessed at the same time. Since data lines of different channels are used at the same time, a wide input/output bandwidth may be accomplished.

The storage device 100 may include a SSD (solid state drive) or a HDD (hard disk drive). The storage device 100 may include memory cards such as a PC card (PCMCIA, personal computer memory card international association), a compact flash card (CF), a smart media card (SM, SMC), a memory stick, a multimedia card (MMC, RS-MMC, MMC-micro), a SD card (SD, miniSD, microSD, SDHC), a USB (universal serial bus) memory card, a universal flash storage (UFS), etc. The storage device 100 may include a mounting type memory such as an eMMC (embedded multimedia card), a UFS, a PPN (perfect page NAND), etc.

In FIG. 17, the storage device 100 may include the RAM 130 outside the controller 120. However, the storage device 100 may not include the RAM 130 outside the controller 120. The controller 120 may use an internal RAM (e.g., refer to FIG. 18) as a buffer memory, an operation memory, or a cache memory.

Figure 18:
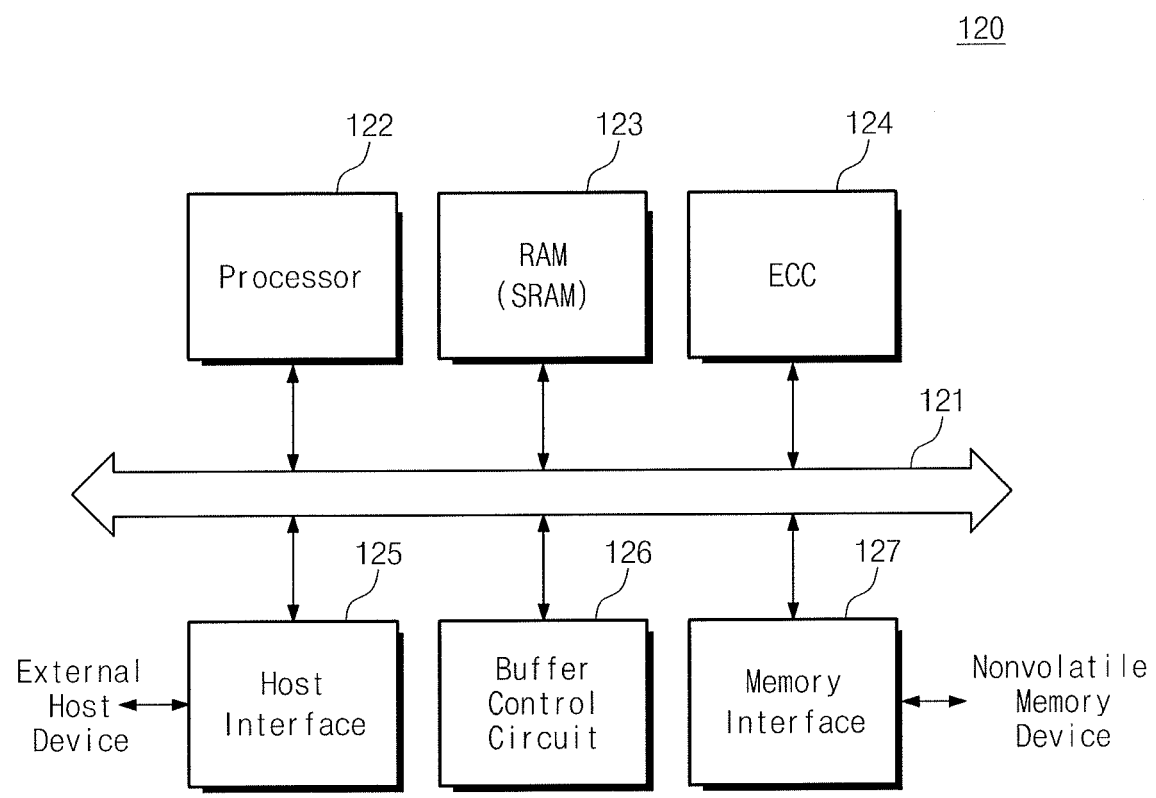
FIG. 18 illustrates an embodiment of a controller.

FIG. 18 illustrates an embodiment of a controller 120. Referring to FIGS. 17 and 18, the controller 120 includes a bus 121, a processor 122, a RAM 123, an error correction block 124, a host interface 125, a buffer control circuit 126, and a memory interface 127. The bus 121 may provide a channel between constituent elements of the controller 120.

The processor 122 may control the overall operation of the controller 120 and perform a logical operation. The processor 122 may communicate with the external host device through the host interface 125, may communicate with the nonvolatile memory device 110 through the memory interface 127, and may communicate with the RAM 130 through the buffer control circuit 126. The processor 122 may use the RAM 123 as an operation memory, a cache memory, or a buffer memory in order to control the storage device 100.

The RAM 123 may be used as an operation memory, a cache memory, or a buffer memory of the processor 122. The RMA 123 may store codes and commands executed by the processor 122. The RAM 123 may store data processed by the processor 122. The RAM 123 may include a SRAM (static RAM).

The error correction block 124 performs an error correction operation. For example, the error correction block 124 may perform error correction encoding based on data to be written in the nonvolatile memory device 110 through memory interface 127. The error correction encoded data may be transmitted to the nonvolatile memory device 110 through the memory interface 127. The error correction block 124 may perform error correction decoding with respect to data received from the nonvolatile memory device 110 through the memory interface 127. The error correction block 124 may be in the memory interface 127, for example, as a constituent part of memory interface 127.

The host interface 125 communicates with an external host under control of the processor 122. The host interface 125 may perform communications through at least one of a plurality of communication protocols or devices, e.g., a USB (universal serial bus), a SAS (serial attachment SCSI), a SATA (serial AT attachment), a SAS (serial attachment SCSI), a HSIC (high speed interchip), a SCSI (small computer system interface), a PCI (peripheral component interconnection), a PCIe (PCI express), a NVMe (nonvolatile memory express), a UFS (universal flash storage), a SD (secure digital), a MMC (multimedia card), an eMMC (embedded MMC), a DIMM (dual in-line memory module), a RDIMM (registered DIMM), or a LRDIMM (load reduced DIMM).

The buffer control circuit 126 controls the RAM 130 according to a control of the processor 122.

The memory interface 127 communicates with the nonvolatile memory device 110 under control of the processor 122. As described with reference to FIG. 1, the memory interface 127 may communicate a command, an address, and data with the nonvolatile memory device 110 through the input/output channel. The memory interface 127 may communicate a control signal with the nonvolatile memory device 110 through the control channel.

When the RAM 130 is not provided to the storage device 100, the buffer control circuit 126 may not be provided to the controller 120.

The processor 122 may control the controller 120 using codes. The processor 122 may load code from a nonvolatile memory device (e.g., read only memory) inside the controller 120. The processor 122 may load code from the nonvolatile memory device 110 through the memory interface 127.

The bus 121 of the controller 120 may be divided into a control bus and a data bus. The data bus may transmit data in the controller 120 and the control bus may transmit control information (e.g., a command and an address) in the controller 120. In one embodiment, the data bus and the control bus may be separate from each other and may not interfere with each other or affect each other. The data bus may be connected to the host interface 125, the buffer control circuit 126, the error correction block 124, and the memory interface 127. The control bus may be connected to the host interface 125, processor 122, buffer control circuit 126, the RAM 123, and memory interface 127.

Figure 19:
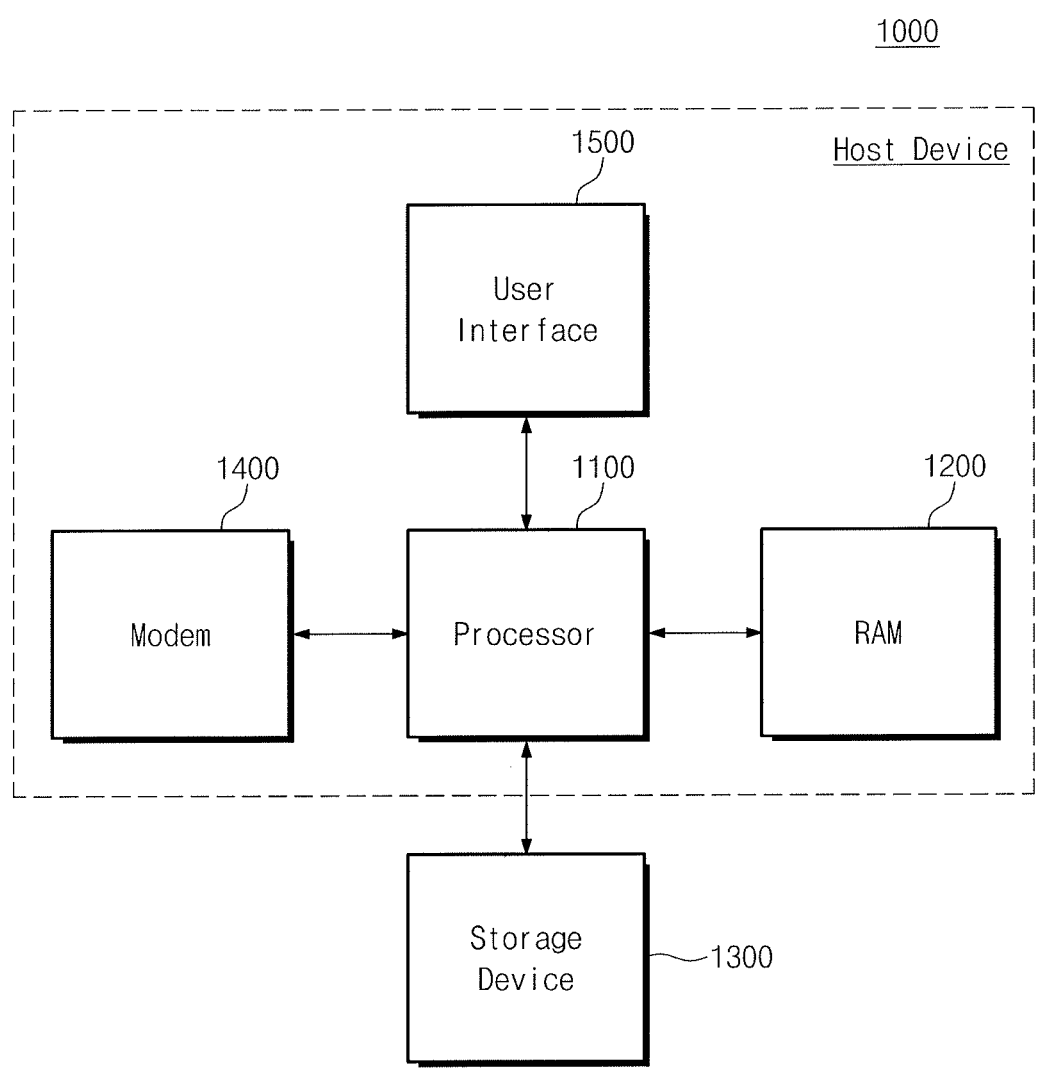
FIG. 19 illustrates an embodiment of a computing device.

FIG. 19 illustrates an embodiment of a computing device 1000 which includes a processor 1100, a memory 1200, a storage device 1300, a modem 1400, and a user interface 1500. The processor 1100 may control overall operation of the computing device 1000 and may perform one or more logical operations. The processor 1100 may be, for example, a hardware-based data processing device including a circuit physically constituted to execute operations expressed by code or a command in a program. For example, the processor 1100 may be constituted by a SoC (system-on-chip). The processor 1100 may be, for example, a general purpose processor, a special purpose processor, or an application processor.

The RAM 1200 communicates with the processor 1100 and may be, for example, a main memory of the processor 1100 or the computing device 1000. The processor 1100 may temporarily store code or data in the RAM 1200. The processor 1100 may execute code and process data using the RAM 1200. The processor 1100 may execute various software, e.g., an OS (operating system) and an application, stored in the RAM 1200. The processor 1100 may control overall operation of the computing device 1000 using the RAM 1200. The RAM 1200 may be, for example, a volatile memory device such as a SRAM (static RAM), a DRAM (dynamic RAM), a SDRAM (synchronous DRAM), etc., or a nonvolatile memory device such as a PRAM (phase-change RAM), a MRAM (magnetic RAM), a RRAM (resistive RAM), a FRAM (ferroelectric RAM), etc.

The storage device 1300 may communicate with the processor 1100. The storage device 1300 may store data to be preserved on a long term basis. In one embodiment, the processor 1100 may store data to be preserved for a long time in the storage device 1300. The storage device 1300 may store a boot image for driving the computing device 1000. The storage device 1300 may store source code of various software, e.g., an OS and an application.

The processor 1100 may drive various software, such as an OS and an application, by loading source code stored in the storage device 1300 into the RAM 1200 and executing the loaded source code into the RAM 1200. The processor 1100 may load data stored in the storage device 1300 into the RAM 1200 and may process data loaded into the RAM 1200. The processor 1100 may store data to be preserved in the long term among data stored in the RAM 1200 in the storage device 1300.

The storage device 1300 may include a nonvolatile memory device such as a flash memory, a PRAM (phase-change RAM), a MRAM (magnetic RAM), a RRAM (resistive RAM), a FRAM (ferroelectric RAM), etc.

The modem 1400 may perform communications with an external device under control of the processor 1100. For example, the modem 1400 may perform a wired or wireless communication with an external device. The modem 1400 may perform communications based on at least one of various wireless communication methods such as a long term evolution (LTE), a WiMax, a global system for mobile communication (GSM), a code division multiple access (CDMA), a Bluetooth, a near field communication (NFC), a WiFi, a radio frequency Identification (RFID), or at least one of various wired communication methods such as a universal serial bus (USB), a serial at attachment (SATA), a HSIC (high speed interchip), a small computer small interface (SCSI), a Firewire, a peripheral component interconnection (PCI), a PCI express (PCIe), a nonvolatile memory express (NVMe), a universal flash storage (UFS), a secure digital (SD), a SDIO, a universal asynchronous receiver transmitter (UART), a SPI (serial peripheral interface), a high speed SPI (HS-SPI), a RS232, an inter-intergrated circuit (I2C), a HS-I2C, an integrated-interchip sound (I2S), a sony/philips digital interface (S/PDIF), a multimedia card (MMC), an embedded MMC (eMMC), etc.

The user interface 1500 may communicate with a user under control of the processor 1100. For example, the user interface 1500 may include user input interfaces such as a keyboard, a keypad, a button, a touch panel, a touch screen, a touch pad, a touch ball, a camera, a mike, a gyroscope sensor, a vibration sensor, etc. The user interface 1500 may include user output interfaces such as a liquid crystal display (LCD), an organic light emitting diode (OLED) display, an active matrix OLED (AMOLED) display, a LED, a speaker, a motor, etc.

The storage device 1300 may include a storage device 100 in accordance with one or more of the aforementioned example embodiments. The processor 1100, the RAM 1200, the modem 1400, and the user interface 1500 may form a host device that communicates with the storage device 1300.

The storage device 1300, as described with reference to FIG. 17, may include the nonvolatile memory device 110 that operate according to any of the method embodiments described with reference to FIGS. 1 to 16. Thus, if the operation speed of the storage device 1300 is improved, the operation speed of the computing device 1000 that accesses the storage device 1300 may also be improved.

In accordance with one embodiment, an apparatus includes first logic to perform a read operation for first cell strings of a memory to generate a first read result; second logic to perform a read operation for second cell strings of the memory to generate a second read result; and third logic to perform a subsequent operation based on a third read result, wherein the third read result is based on the first read result and the second read result. The first, second, and third logic may correspond to the constituent elements corresponding to any of the aforementioned embodiments. The read operations for the first and second cell strings may be erase verify read operations, pass/fail check read operations with respect to select transistors of the first and second cell strings, or reliability test read operations with respect to some of a plurality of memory cells of the first and second cell strings. The memory may be, for example, a three-dimensional memory.

The logic, logic circuits, decoders, encoders, selectors, and selection circuits described herein may include hardware, software, or both. When implemented at least partially in hardware, the logic, logic circuits, decoders, encoders, selectors, and selection circuits may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the logic, logic circuits, decoders, encoders, selectors, and selection circuits may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods herein.

In accordance with one or more of the aforementioned embodiments, when verify read operations are performed with respect to a plurality of string select lines, a pass/fail check operation is performed corresponding to a number of times less than the number of the verify read operations. Thus, a nonvolatile memory device having improved operation speed and a method for operating the nonvolatile memory device may be provided.

Example embodiments have been disclosed herein, and although specific terms are employed, they are used and are to be interpreted in a generic and descriptive sense only and not for purpose of limitation. The embodiments may be combined to form additional embodiments. In some instances, features, characteristics, and/or elements described in connection with a particular embodiment may be used singly or in combination with features, characteristics, and/or elements described in connection with other embodiments unless otherwise Accordingly, various changes in form and details may be made without departing from the spirit and scope of the embodiments set forth in the claims.

What is claimed is:

1. A nonvolatile memory device, comprising:
a memory cell array including a plurality of cell strings connected to a plurality of select lines, each of the select lines connected to two or more cell strings, each of the cell strings including memory cells connected to a plurality of word lines, and a select transistor connected to a corresponding one of the select lines among the plurality of select lines;
a row decoder to sequentially select the plurality of select lines in a read operation;
a page buffer to obtain a read result of the two or more cell strings when a corresponding select line is selected and to accumulate read results of the plurality of cell strings when the plurality of select lines is sequentially selected; and
a pass/fail check circuit to check either a pass or a fail based on the accumulated read results, wherein the pass/fail check circuit counts a first bit value between the first bit value and a second bit value from the accumulated read results,
the read operation is a pass/fail check read operation with respect to the select transistors of the plurality of cell strings,
the first bit value corresponds to an on-cell being turned on or an off-cell being turned off in the pass/fail check read operation, and
when a count value of the pass/fail check circuit is greater than a critical value, the control logic is to perform a select transistor fail process.

2. The device as claimed in claim 1, wherein:
the plurality of cell strings is connected to a plurality of bit lines that extends in a direction crossing the plurality of select lines, each of the bit lines connected to two or more cell strings, and
when the plurality of select lines is sequentially selected, the page buffer is to accumulate the read results of the two or more cell strings connected to a corresponding one of the bit lines.

3. The device as claimed in claim 2, wherein:
when the plurality of select lines is sequentially selected, the page buffer is to generate the accumulated read result as one final read result for a corresponding one of the bit lines based on the read results of the two or more cell strings connected to the corresponding one of the bit lines.

4. The device as claimed in claim 1, wherein:
the read operation is an erase verify read,
the first bit value corresponds to an on-cell being turned on in the erase verify read, and when a count value of the pass/fail check circuit is greater than a critical value, the control logic is to control the row decoder and the page buffer to perform a next erase loop.

5. The device as claimed in claim 4, wherein:
when a first select line is selected among the plurality of select lines, the page buffer is to store the read result of the two or more cell strings connected to the first select line in two or more latches, and
when a second select line is selected among the plurality of select lines, the page buffer is to update values stored in the two or more latches according to the read result of the two or more cell strings connected to the second select line.

6. The device as claimed in claim 5, wherein:
after the read results of the plurality of cell strings are accumulated in the two or more latches while sequentially selecting the plurality of select lines, the page buffer is to output the accumulated values in the two or more latches to the pass/fail check circuit.

7. The device as claimed in claim 6, wherein:
when each of the select lines is selected, the page buffer is to obtain the read result from all memory cells that belong to the two or more cell strings connected to the selected select line.

8. The device as claimed in claim 1, wherein:
each of the cell strings includes at least one second select transistor coupled to at least one second select line, and
when each of the select lines is selected, the page buffer is to obtain the read result from one of the select transistor or the at least one second select transistor that belongs to each of the two or more cell strings connected to the selected select line.

9. A nonvolatile memory device, comprising:
a memory cell array including a plurality of cell strings connected to a plurality of select lines, each of the select lines connected to two or more cell strings, each of the cell strings including memory cells connected to a plurality of word lines, and a select transistor connected to a corresponding one of the select lines among the plurality of select lines;
a row decoder to sequentially select the plurality of select lines in a read operation;
a page buffer to obtain a read result of the two or more cell strings when a corresponding select line is selected and to accumulate read results of the plurality of cell strings when the plurality of select lines is sequentially selected; and
a pass/fail check circuit to check either a pass or a fail based on the accumulated read results, wherein the pass/fail check circuit counts a first bit value between the first bit value and a second bit value from the accumulated read results, the read operation is a reliability test read operation with respect to some memory cells among memory cells of the plurality of cell strings,
the first bit value corresponds to an on-cell being turned on or an off-cell being turned off in the reliability read operation, and
when a count value of the pass/fail check circuit is greater than a critical value, the control logic is to perform a reliability fail process.

10. The device as claimed in claim 9, wherein:
memory cells corresponding to a same select line and a same word line form a physical page, and
when each of the select lines is selected, the page buffer is to obtain the read result from one physical page corresponding to the selected select line among physical pages.

11. The device as claimed in claim 1, wherein:
the memory cell array includes a plurality of memory blocks, and
the plurality of cell strings from which the accumulated read results are obtained belongs to one memory block.

12. The device as claimed in claim 1, wherein:
memory cells of the plurality of cell strings are stacked in a direction perpendicular to a substrate, and
each of the memory cells and select transistors of the plurality of cell strings includes a charge trapping layer.

13. A method for operating a nonvolatile memory device including a plurality of cell strings, each of the cell strings including a plurality of memory cells, the method comprising:
obtaining a first read result by performing a read operation with respect to first cell strings among the plurality of cell strings;
obtaining a second read result by performing a read operation with respect to second cell strings among the plurality of cell strings;
generating a third read result by accumulating the first read result and the second read result; and
checking either a pass or a fail according to the third read result,
wherein checking either a pass or a fail comprises:
counting a first bit value between the first bit value and a second bit value from the third read result,
wherein the read operation is one of a pass/fail check read operation and a reliability test read operation with respect to some memory cells among memory cells of the plurality of cell strings,
the first bit value corresponds to an on-cell being turned on or an off-cell being turned off in the reliability test read operation, and
when a count value of the pass/fail check circuit is greater than a critical value, the control logic is to perform one of a select transistor fail process and a reliability fail process.

* * * * *